(12) United States Patent
Lee et al.

(10) Patent No.: US 6,963,094 B2
(45) Date of Patent: Nov. 8, 2005

(54) METAL OXIDE SEMICONDUCTOR TRANSISTORS HAVING A DRAIN PUNCH THROUGH BLOCKING REGION AND METHODS FOR FABRICATING METAL OXIDE SEMICONDUCTOR TRANSISTORS HAVING A DRAIN PUNCH THROUGH BLOCKING REGION

(75) Inventors: Byeong-Chan Lee, Yongin-si (KR); Si-Young Choi, Seongnam-si (KR); Chul-Sung Kim, Seongnam-si (KR); Jong-Ryeol Yoo, Osan-si (KR); Deok-Hyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 10/394,338

(22) Filed: Mar. 21, 2003

(65) Prior Publication Data

US 2004/0021179 A1 Feb. 5, 2004

(30) Foreign Application Priority Data

Aug. 5, 2002 (KR) .......................................... 2002-46159

(51) Int. Cl.$^7$ ........................ H01L 29/76; H01L 21/336; H01L 21/8234

(52) U.S. Cl. ........................ 257/288; 257/355; 257/362; 257/497; 438/197; 438/303; 438/479; 438/586

(58) Field of Search ............................... 257/288, 355, 257/358, 362, 497, 498; 438/197, 218, 299, 301, 303, 479, 585, 586, 622, 629, 637

(56) References Cited

U.S. PATENT DOCUMENTS

| | | | | |
|---|---|---|---|---|
| 5,543,647 A | * | 8/1996 | Kobayashi et al. | 257/345 |
| 5,698,869 A | * | 12/1997 | Yoshimi et al. | 257/192 |
| 5,831,305 A | * | 11/1998 | Kim | 257/338 |
| 5,898,206 A | * | 4/1999 | Yamamoto | 257/360 |
| 5,930,642 A | * | 7/1999 | Moore et al. | 438/407 |
| 5,981,345 A | | 11/1999 | Ryum et al. | 438/303 |
| 5,981,354 A | | 11/1999 | Spikes et al. | 438/424 |
| 6,172,402 B1 | * | 1/2001 | Gardner et al. | 257/347 |
| 6,271,087 B1 | * | 8/2001 | Kinoshita et al. | 438/258 |
| 6,281,054 B1 | * | 8/2001 | Yeo | 438/149 |
| 6,319,772 B1 | * | 11/2001 | Tee et al. | 438/256 |
| 6,320,236 B1 | * | 11/2001 | Krivokapic et al. | 257/402 |
| 6,380,010 B2 | * | 4/2002 | Brigham et al. | 438/161 |
| 6,437,404 B1 | * | 8/2002 | Xiang et al. | 257/347 |
| 6,451,708 B1 | * | 9/2002 | Ha | 438/738 |
| 6,642,557 B2 | * | 11/2003 | Liang | 257/213 |
| 6,724,049 B2 | * | 4/2004 | Fujiwara | 257/354 |

\* cited by examiner

*Primary Examiner*—T. N. Quach
(74) *Attorney, Agent, or Firm*—Myers Bigel Sibley & Sajovec, PA

(57) ABSTRACT

Metal oxide semiconductor transistors and devices with such transistors and methods of fabricating such transistors and devices are provided. Such transistors may have a silicon well region having a first surface and having spaced apart source and drain regions therein. A gate insulator is provided on the first surface of the silicon well region and disposed between the source and drain regions and a gate electrode is provided on the gate insulator. A region of insulating material is disposed between a first surface of the drain region and the silicon well region. The region of insulating material extends toward but not to the source region. A source electrode is provided that contacts the source region. A drain electrode contacts the drain region and the region of insulating material.

41 Claims, 23 Drawing Sheets

METAL OXIDE SEMICONDUCTOR TRANSISTORS HAVING A DRAIN PUNCH THROUGH BLOCKING REGION AND METHODS FOR FABRICATING METAL OXIDE SEMICONDUCTOR TRANSISTORS HAVING A DRAIN PUNCH THROUGH BLOCKING REGION

RELATED APPLICATIONS

This application claims priority to Korean Patent Application No. 2002-0046159, filed Aug. 5, 2002, the contents of which are herein incorporated by reference in their entirety.

FIELD OF THE INVENTION

The present invention relates to a semiconductor devices and more particularly to metal oxide semiconductor (MOS) transistors and methods for fabricating MOS transistors.

BACKGROUND OF THE INVENTION

FIG. 1 is a cross-sectional view illustrating a conventional MOS transistor. As seen in FIG. 1, a conventional MOS transistor has a gate electrode 14, a source region 16a, and a drain region 16b. The gate electrode 14 is formed on a semiconductor substrate 10 wherein a gate oxide film 12 is interposed between the gate electrode 14 and the semiconductor substrate 10. The source and the drain regions 16a and 16b are formed on the semiconductor substrate 10 and the gate electrode 14 is disposed between the source and the drain regions 16a and 16b. The source region 16a supplies carriers (electrons or holes), and the drain region 16b extracts the carriers. The gate electrode 14 serves to form a channel in which the source region 16a is electrically connected to the drain region 16b. As is further illustrated in FIG. 1, an insulating spacer 18 may also be formed on the sidewall of the gate electrode 14.

As semiconductor devices become more highly integrated and the length of the gate electrode is reduced, the channel length (distance from source to drain) of the MOS transistor is, typically, also reduced. In a MOS transistor, the distribution of the electric field and the electrical potential in the channel region should be controlled by the voltage applied to the gate electrode. However, as the channel length of the MOS transistor is reduced, the channel region may be affected not only by the voltage applied to the gate electrode but also by the charge and/or the distribution of the electric field and/or electrical potential in the depletion layers between the source and the drain regions. Such affects may result in detrimental punch through or leakage currents.

Punch through may result from the depletion layer in the source region with contacting the depletion layer in the drain region. Punch through is illustrated in FIGS. 2 and 3. FIG. 2 is a schematic cross-sectional view showing the drain depletion layer of a conventional MOS transistor when the drain voltage is approximately 3V. FIG. 3 is a schematic cross-sectional view showing the drain depletion layer of a conventional MOS transistor when the drain voltage is approximately 7V.

As shown in FIGS. 2 and 3, the drain depletion layer approaches the source region because the drain depletion layer extends in proportion to the increase in the drain voltage. Thus, when the channel length is shortened, the drain depletion layer may be connected to the source depletion layer. In such a case, current can flow between the source and the drain regions S and D without the formation of the channel because the drain electric field affects the source region S so as to reduce the diffusion potential near the source region S. Such a phenomenon is referred to as a "punch through." When punch through occurs, the drain current rapidly increases without the need for saturation in a saturation region of the transistor.

In addition, an electric field is generated between the bulk region of the substrate and the drain region D when a voltage is applied to the drain region of the MOS transistor. If the drain region D is highly doped, leakage current may flow from the drain region D to the bulk region of the substrate because the strength of the electric field between the bulk region and the drain region D increases. Thus, failures may occur in a semiconductor device, such as a memory device, in which charge should be preserved when the charge is leaked as a result of the leakage current. Thus, conventionally, the drain region D is not highly doped. However, without a highly doped drain, the contact resistance between the drain region D and the conductive material contacting the drain region D may increase. Also, the contact resistance may increase with the reduction of contact area between the drain region D and the conductive material that may result from decreasing the area of the MOS transistor.

To overcome the above-mentioned problems, U.S. Pat. No. 5,981,345 discloses a method for isolating the source region from the drain region and using a silicon film or a silicon-germanium (Si—Ge) film as the channel region. However, the formations of the source and the drain regions may be difficult to control because the source and the drain regions are formed by diffusing the impurities doped in a conductive film for the source and the drain regions toward the channel region.

SUMMARY OF THE INVENTION

Embodiments of the present invention provide metal oxide semiconductor transistors and methods of fabricating such transistors having a silicon well region having a first surface and a second surface and having spaced apart source and drain regions therein. A gate insulator is provided on the first surface of the silicon well region and disposed between the source and drain regions and a gate electrode is provided on the gate insulator. A region of insulating material is disposed between a first surface of the drain region and the silicon well region. The region of insulating material extends toward but not to the source region. A source electrode is provided that contacts the source region. A drain electrode contacts the drain region and the region of insulating material.

In further embodiments of the present invention, the region of insulating material comprises a region of silicon oxide. Furthermore, a buried layer of silicon-germanium that is disposed within the silicon well region and extends beneath the gate insulator may also be provided. In such a case, the region of insulating material may make contact with a side portion of the silicon-germanium buried layer.

Furthermore, in certain embodiments of the present invention, the drain region has a higher impurity concentration than the source region. Also, the drain electrode may extend beyond the first surface of the silicon well region and into the silicon well region to contact the region of insulating material and contact the drain region on a sidewall of the drain region.

In additional embodiments of the present invention, the region of insulating material does not extend beneath the gate electrode. The region of insulating material could also extend partially beneath the gate electrode.

Further embodiments of the present invention provide a method for forming a metal oxide semiconductor transistor and resulting transistors by successively forming a silicon-germanium film and a silicon film on a silicon substrate. Gate electrode structures are formed on the silicon film wherein each of the gate electrode structures includes a gate oxide pattern and a conductive pattern. Impurities are implanted into the silicon film using the gate electrode structures as a mask so as to form source and drain regions. Nitride spacers are formed on sidewalls of the gate electrode structures. The silicon film is selectively etched in the drain region exposed between the nitride spacers so as to expose the silicon-germanium film. The exposed silicon-germanium film is selectively etched so as to form a hole extending from the exposed silicon-germanium film in vertical and lateral directions with respect to the substrate. A silicon oxide film is formed in the hole.

Additional embodiments of the present invention selectively implant an impurity into the drain region after forming the nitride spacers so as to provide a drain region with a higher impurity concentration than the source region. Furthermore, a portion of the silicon oxide film formed in the hole may be anisotropically etched to partially expose the drain region and a conductive material deposited to fill an area between the gate electrode structures so as to form pad electrodes making contact with the source and the drain regions, respectively.

Still further embodiments of the present invention provide method for manufacturing a semiconductor device having a metal oxide semiconductor transistor by successively forming a silicon-germanium film and a silicon film on a silicon substrate and forming gate electrode structures on the silicon film. Each of the gate electrode structures includes a gate oxide pattern and a conductive pattern. Impurities are implanted into the silicon film using the gate electrode structures as masks to form a source region and a drain region. Nitride spacers are formed on sidewalls of the gate electrode structures and an interlayer dielectric film is formed on the nitride spacers such that the interlayer dielectric film covers the gate electrode structures. A first contact hole is formed between the gate electrode structures by etching the interlayer dielectric film to partially expose first faces of the source and drain regions. A portion of the silicon film including the drain region exposed through the first contact hole is selectively etched to form a second contact hole exposing the silicon-germanium film. The exposed silicon-germanium film is selectively etched to form a third hole extending from the exposed silicon-germanium film in vertical and lateral directions with respect to the substrate. A silicon oxide film is formed in the third hole.

Other embodiments of the present invention provide a method for manufacturing a semiconductor device having a metal oxide semiconductor transistor by forming an active region and a field region on a silicon substrate so that a first face of the field region extends beyond a corresponding first face of the active region, selectively forming an oxide film on the active region, etching the oxide film to expose portions of the substrate corresponding to the active region and forming a silicon film on an entire upper face of the oxide film by a selective epitaxial growth process utilizing silicon in the exposed portions of the substrate as seeds. Gate electrode structures are formed on the silicon film positioned on the etched portion of the oxide film wherein each of the gate electrode structures includes a gate oxide pattern and a conductive pattern. Impurities are implanted into the silicon film using the gate electrode structures as masks to form source and drain regions. Nitride spacers are formed on sidewalls of the gate electrode structures and an interlayer dielectric film formed on the nitride spacers wherein the interlayer dielectric film covers the gate electrode structures. The interlayer dielectric is etched using a self-aligning process to form a first contact hole between the gate electrode structures that partially exposes first faces of the source and the drain regions.

In still further embodiments of the present invention, a method for manufacturing a semiconductor device having a metal oxide semiconductor transistor is provided by forming gate electrode structures on a silicon substrate wherein each of the gate electrode structures includes an oxide pattern and a conductive pattern and implanting impurities into the silicon substrate using the gate electrode structures as masks to provide source and drain regions. Nitride spacers are formed on sidewalls of the gate electrode structures and an interlayer dielectric film formed on the nitride spacers. The interlayer dielectric film covers the gate electrode structures. The interlayer dielectric film is etched between the gate electrode structures to partially expose a first face of the drain region using a self-aligning process to provide a first contact hole. A portion of the silicon substrate exposed though the first contact hole is selectively and anisotropically etched to provide a second contact hole. The portion corresponds to the drain region and the second contact hole is formed to a second face of the drain region opposite the first face of the drain region. A spacer is formed on a lateral portion of the drain region using a material having an etching selectivity relative to the silicon substrate and an interlayer dielectric film is formed on the nitride spacers to cover the gate electrode structures. A portion of the silicon substrate exposed through the second contact hole is etched to form a third hole. The third hole extends in vertical and lateral directions with respect to the silicon substrate. A silicon oxide film is formed in the third hole.

DESCRIPTION OF THE PREFERRED EMBODIMENTS

Figure 1:
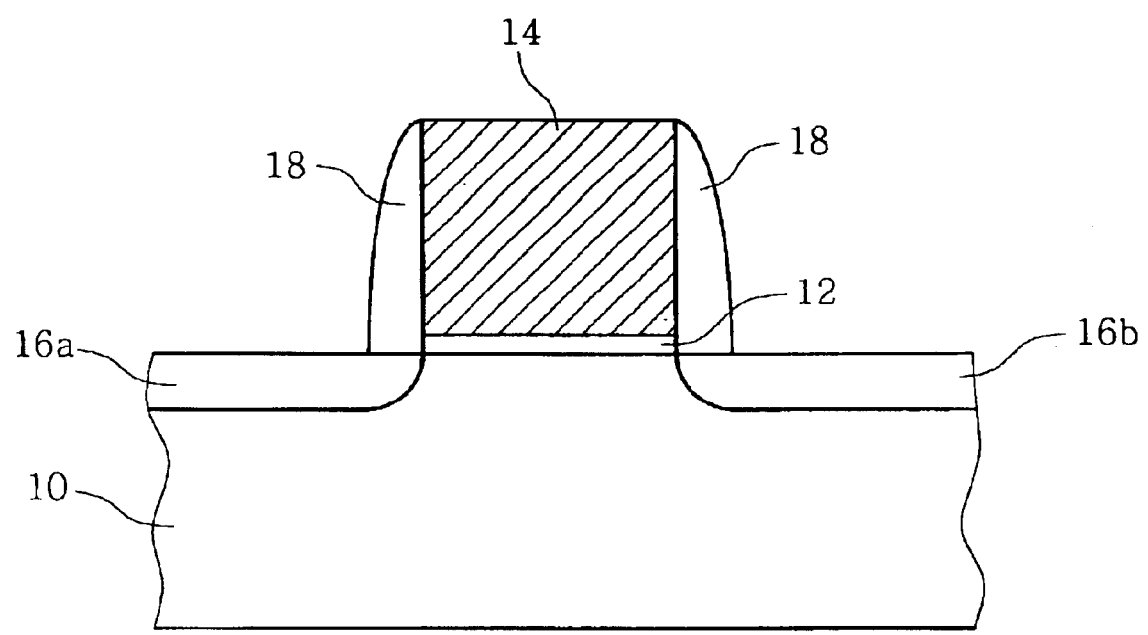
FIG. 1 is a cross-sectional view illustrating a conventional MOS transistor.
Figure 2:
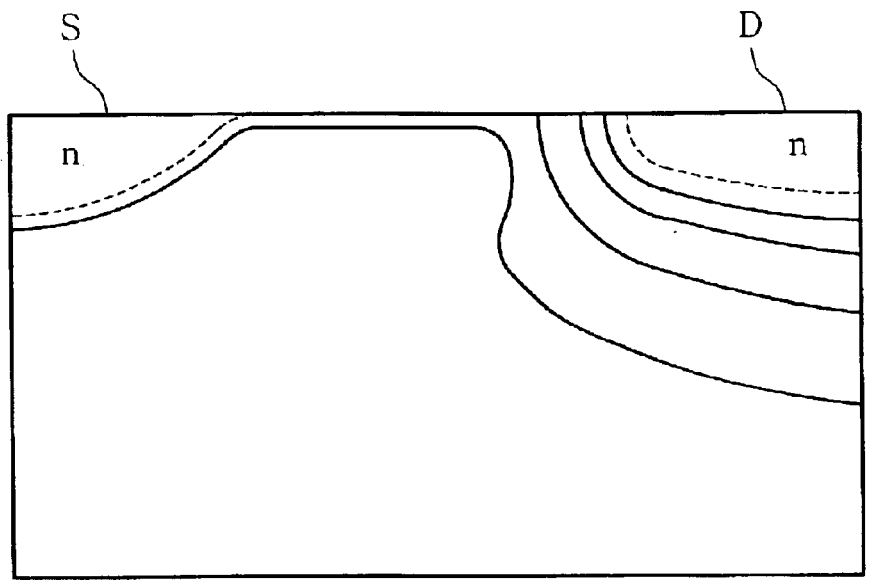
FIGS. 2 and 3 are schematic cross-sectional views showing the depletion layers formed among a source region, a drain region and a P-typed well, respectively of a conventional MOS transistor.
Figure 3:
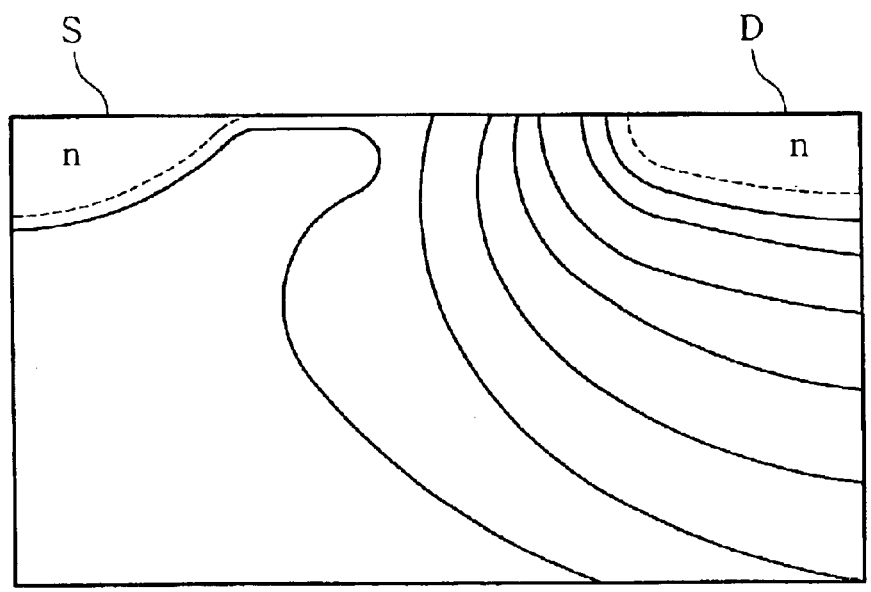

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It also will be understood that when a layer or region is referred to as being "on" another layer or region, it can be directly on the other layer or region or intervening layers or regions may be present. In contrast, when a layer or region is referred to as being "directly on" another layer or region, there are no intervening layers or regions present.

In the drawings, the thickness of layers and regions are exaggerated for clarity. Furthermore, relative terms, such as "beneath", "upper", "top" or "bottom" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as "below" other elements in reference to the original figure would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 4:
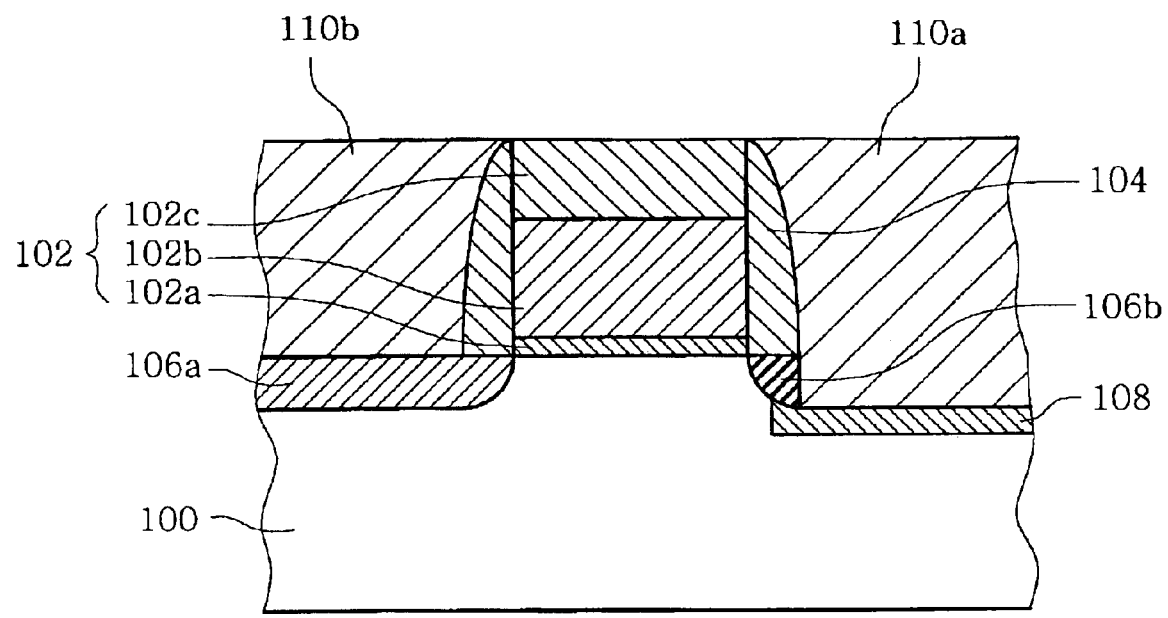
FIG. 4 is a cross-sectional view illustrating a transistor according to embodiments of the present invention.

FIG. 4 is a cross-sectional view illustrating a MOS transistor according to embodiments of the present invention. Referring to FIG. 4, a first silicon film 100 is provided. Optionally, a silicon-germanium (Si—Ge) film may be partially formed on the first silicon film 100. The first silicon film 100 may include a portion of a silicon substrate or a silicon substrate itself. A gate structure 102 is formed on the first silicon film 100. The gate structure 102 may include a gate oxide pattern 102a, a conductive pattern 102b, and a nitride pattern 102c. A spacer 104 is also provided on the sidewall of the gate structure 102.

In the gate structure 102 illustrated in FIG. 4, the gate oxide pattern 102a and the conductive pattern 102a together serve as a gate electrode. A source region 106a and a drain region 106b are formed on the first silicon film 100 adjacent opposite sides of the gate structure 102. The source region 106a and the drain region 106b may be doped with a first impurity and a second impurity, respectively. The impurity concentration of the drain region 106b is higher than that of the source region 106a.

A blocking pattern 108 is formed beneath the drain region 106b in order to reduce and/or prevent the generation of a depletion layer in the first silicon film 100. The blocking pattern 108 may be a silicon oxide, silicon nitride or silicon oxynitride and may have a thickness of approximately 100 to 500 Å. The blocking pattern 108 may prevent the depletion layer otherwise caused by the voltage applied to the drain region 106b from being generated between the bottom face of the drain region 106b and the first silicon film 100 (hereinafter referred to as a well). As will be appreciated by those of skill in the art, the well 100 may be a layer, substrate or combinations thereof.

A first pad electrode 110a simultaneously makes contact with the side portion of the drain region 106b and with the blocking pattern 108. A second pad electrode 110b makes contact with the upper face of the source region 106a.

In the MOS transistor having the above-described structure, the bottom faces of the drain region 106b and the first pad electrode 110a are separated from the well 100 by the blocking pattern 108. Thus, when a predetermined voltage is applied to the drain region 106b through the first pad electrode 110a, the depletion layer is not formed between the well 100 and the bottom faces of the drain region 106b and the first pad electrode 110a due to the blocking pattern 108. The depletion layer may be formed between the well 100 and a side portion of the drain region 106b disposed in the direction in which a channel is formed. However, the depletion layer has a widest area toward the bottom face of the well 100 from the bottom face of the drain region 106b. Thus, the blocking pattern 108 is formed beneath the bottom faces of the drain region 106b and the first pad electrode 110a and, therefore, may reduce the extension of the depletion layer. Because the depletion layer is not formed or is reduced beneath the source region 106a because the voltage is, typically, not applied to the source region 106a, the blocking pattern 108 need only be formed beneath the drain region 106b and the first pad electrode 110a. Furthermore, because the drain region 106b is more highly doped than that of the source region 106a, the contact resistance between the drain region 106b and the first pad electrode 110a can be reduced, thereby enhancing the performance of the MOS transistor. Also, because the contact to the drain region 106b is provided on a sidewall of the drain region 106b, the contact resistance will, generally, not be increased with reductions in lateral drain size.

Fabrication of various embodiments of the present invention will now be described with reference to FIGS. 5A through 7K. FIGS. 5A to 5L are cross-sectional views illustrating a method for forming a semiconductor device including the transistor according to particular embodiments of the present invention. FIGS. 5A through 5L illustrate the formation of a semiconductor device having an NMOS transistor.

Figure 5A:
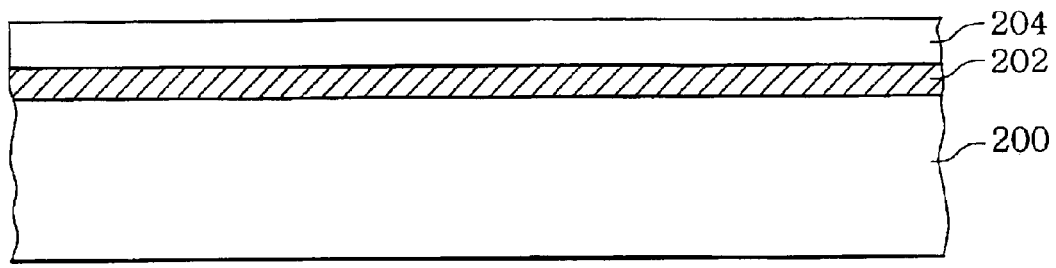
FIGS. 5A to 5L are cross-sectional views illustrating a method for forming a semiconductor device including the transistor according to embodiments of the present invention.

Referring to FIG. 5A, a silicon-germanium film 202 and a silicon film 204 are successively formed on a silicon substrate 200. For example, the silicon-germanium film 202 may be formed on the silicon substrate 200 by an epitaxial growth process such that the silicon-germanium film 202 has the crystal structure identical to that of the silicon substrate 200. The silicon-germanium film 202 may have a thickness of approximately 100 to 500 Å.

The silicon film 204 may be formed on the silicon-germanium film 202 via an epitaxial growth process. With an epitaxial growth process, a film can be formed on an underlying layer to have the crystal axis identical to that of the underlying layer. Thus, the silicon film 204 may have a crystal structure identical to that of the silicon substrate 200. Because the source and the drain regions of a MOS transistor will be formed at regions of the silicon film 204, the silicon film 204 may have a thickness substantially the same as or identical to the depths of the source and the drain regions. For example, the silicon film 204 may have a thickness of approximately 200 to 1,000 Å.

Next, a P-well where the NMOS transistor is formed is formed on the substrate 200 including the silicon-germanium film 202 and the silicon film 204 formed thereon by a well formation process such as a diffusion well process or an ion implanting process.

Figure 5B:
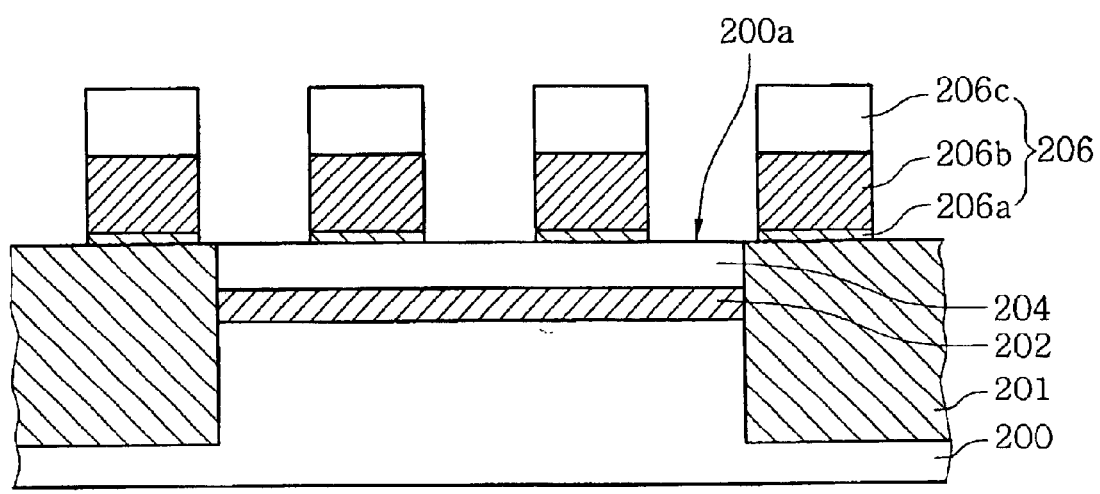

Referring to FIG. 5B, the gate structures 206 are formed on the silicon film 204. Each of the gate structures 206 includes a gate oxide pattern 206a, a polysilicon pattern 206b and a nitride pattern 206c. In particular, after the silicon film 204 is divided into an active region 200a and a field region 201 through an isolation process, a gate oxide film is blanket formed on the silicon film 204 to have a thickness of approximately 50 to 150 Å. A polysilicon film doped with an N-typed impurity is formed on the gate oxide film so that the polysilicon film has a thickness of approximately 1,000 to 1,500 Å. The polysilicon film serves as the gate electrode of the MOS transistor. To reduce the resistance of the gate electrode, a tungsten (W) film, a tungsten silicide ($WSi_x$) film, a titanium silicide ($TiSi_x$) film or a tantalum silicide ($TaSi_x$) may be additionally formed on the polysilicon film. Then, a nitride film is formed on the polysilicon film.

After a photoresist pattern (not shown) is formed to define portions of the nitride film where the gate electrodes are positioned, portions of the nitride film, the polysilicon film and the gate oxide film are successively etched. Subsequently, the photoresist pattern is removed through a plasma etching process and a stripping process using sulfuric acid, thereby forming the gate structures 206, each including the gate oxide pattern 206a, the polysilicon pattern 206b, and the nitride pattern 206c.

Figure 5C:
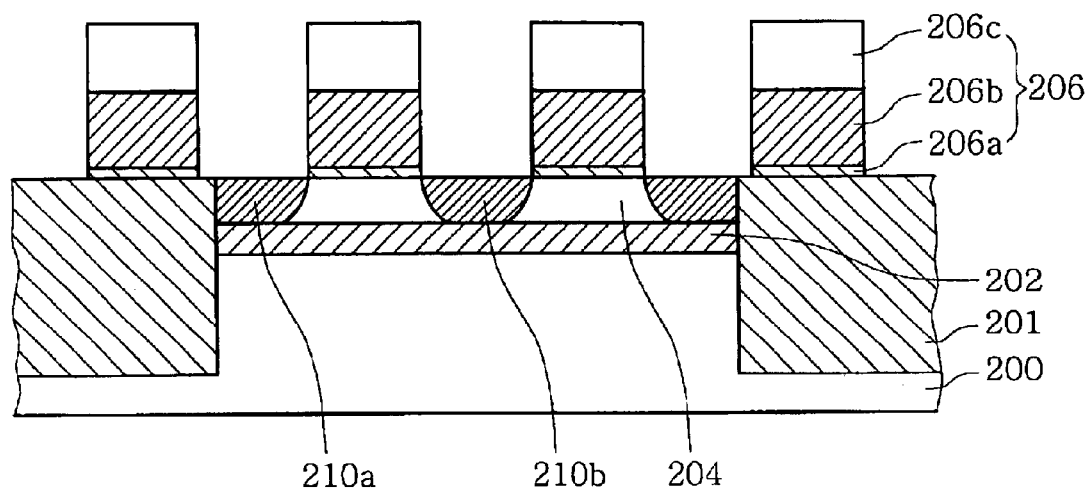

Referring to FIG. 5C, N-type impurities are implanted into the silicon film 204 using the gate structures 206 as masks such that a source region 210a and a drain region 210b are formed on the silicon film 204. The N-type impurities are implanted to a bottom portion of the silicon film 204 adjacent the silicon-germanium film 202.

Figure 5D:
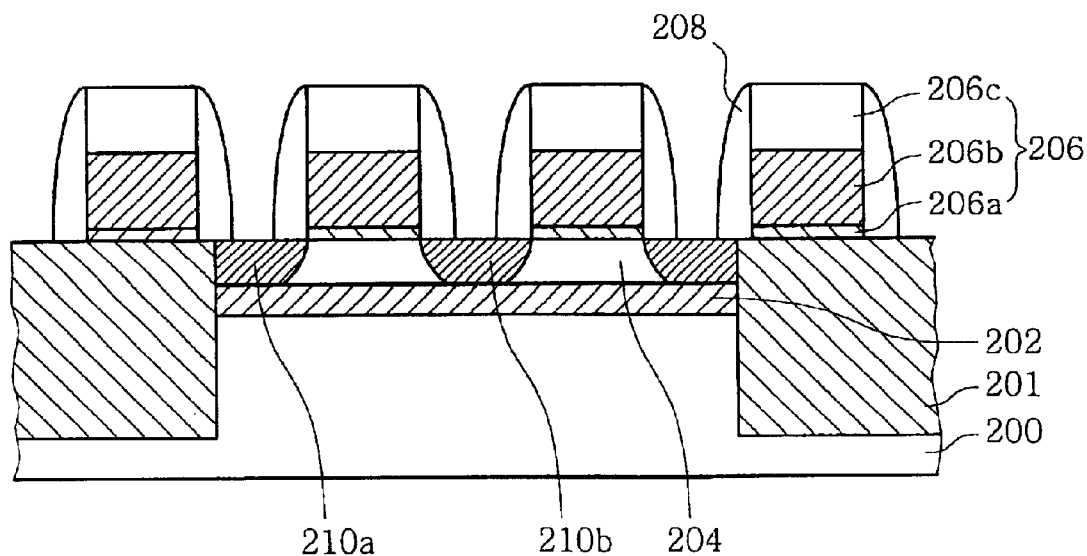

Referring to FIG. 5D, after a nitride film is blanket formed on the silicon film 204 where the resultant structures are formed, the nitride film is anisotropically etched so that the nitride film remains only on the sidewalls of the gate structures 206, thereby forming nitride spacers 208 on the sidewalls of the gate structures 206, respectively.

Figure 5E:
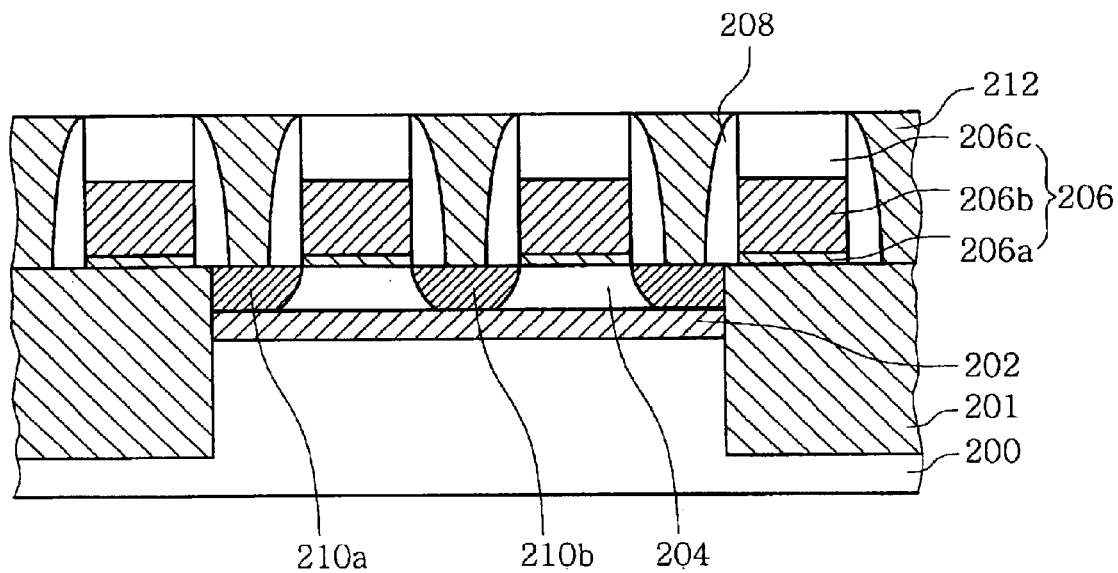

Referring to FIG. 5E, an insulation film 212 is formed on the silicon film 204 to cover the gate structures 206. The insulation film 212 is formed so as to fill the gap between the gate structures 206. Then, the surface of the insulation film 212 is polished such that the insulation film 212 has an even surface.

Figure 5F:
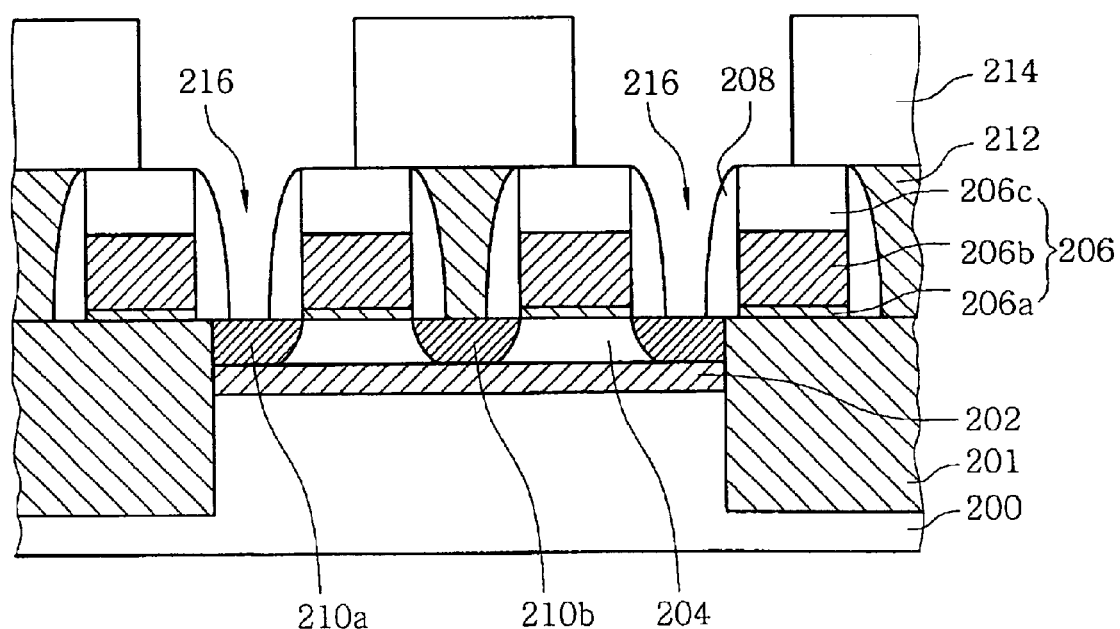

Referring to FIG. 5F, a first photoresist pattern 214 is formed on the gate structures 206 to open the source regions 210a between the gate structures 206. Portions of the insulation film 212 between the gate structures 206 are etched using the first photoresist pattern 214 as an etching mask such that first contact holes 216 are formed to partially expose the source regions 210a. The first contact holes 216 may be formed through a self-aligning process utilizing the etching selectivity between the insulation film 212 and the nitride spacers 208. Then, the first photoresist pattern 214 is removed.

Figure 5G:
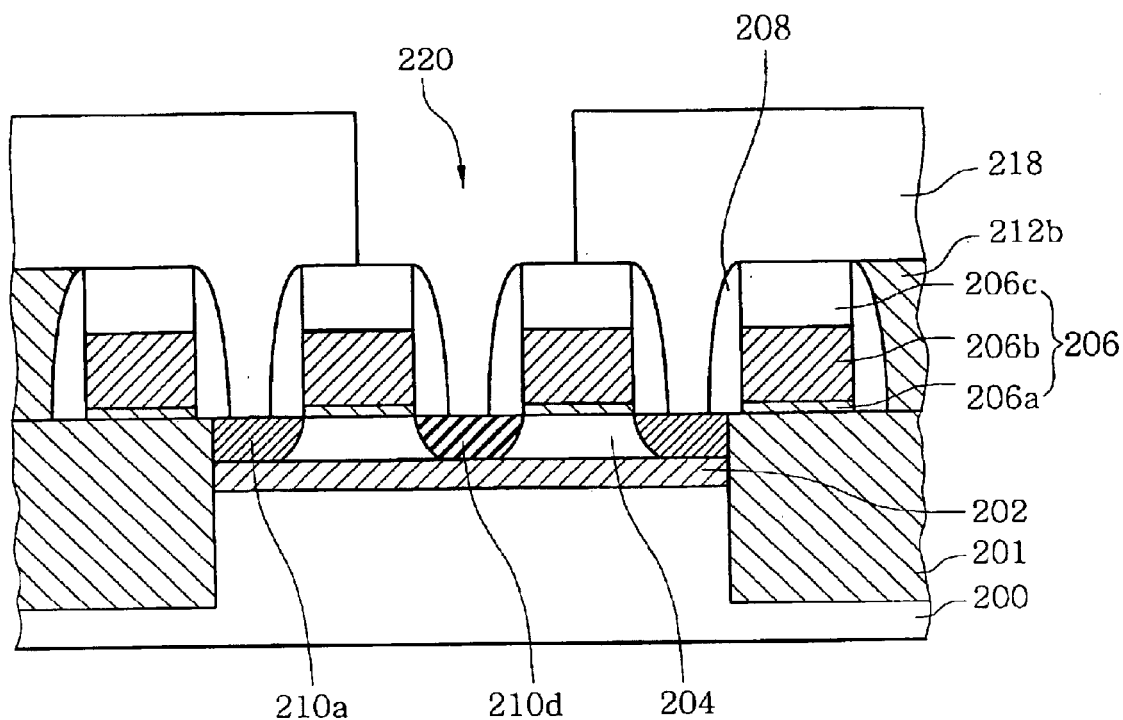

Referring to FIG. 5G, a second photoresist pattern 218 is formed on the gate structures 206 to open the drain region 210d between the gate structures 206. The second photoresist pattern 218 is formed to cover the first contact holes 216. Then, the portion of the insulation film 212b between the gate structures 206 is etched using the second photoresist pattern 218 as an etching mask so that a second contact hole 220 is formed to partially expose the drain region 210d. The second contact hole 220 may also be formed through the self-aligning process utilizing the etching selectivity between the insulation film 212b and the nitride spacers 208.

Subsequently, an N-type impurity is additionally implanted into the drain region 210d exposed through the second contact hole 128. Because the N-type impurity is additionally injected into the drain region 210d, the drain region 210d has the impurity concentration higher than that of the source region 210a. In particular embodiments, the impurity can be implanted into the drain region 210d at energy of approximately 1 to 50 KeV. With such energy, the damage to the substrate 200 may be minimized during the impurity implanting process while the impurity concentration of the drain region 210d may be increased to a level higher than that of the source region 210a.

Figure 5H:
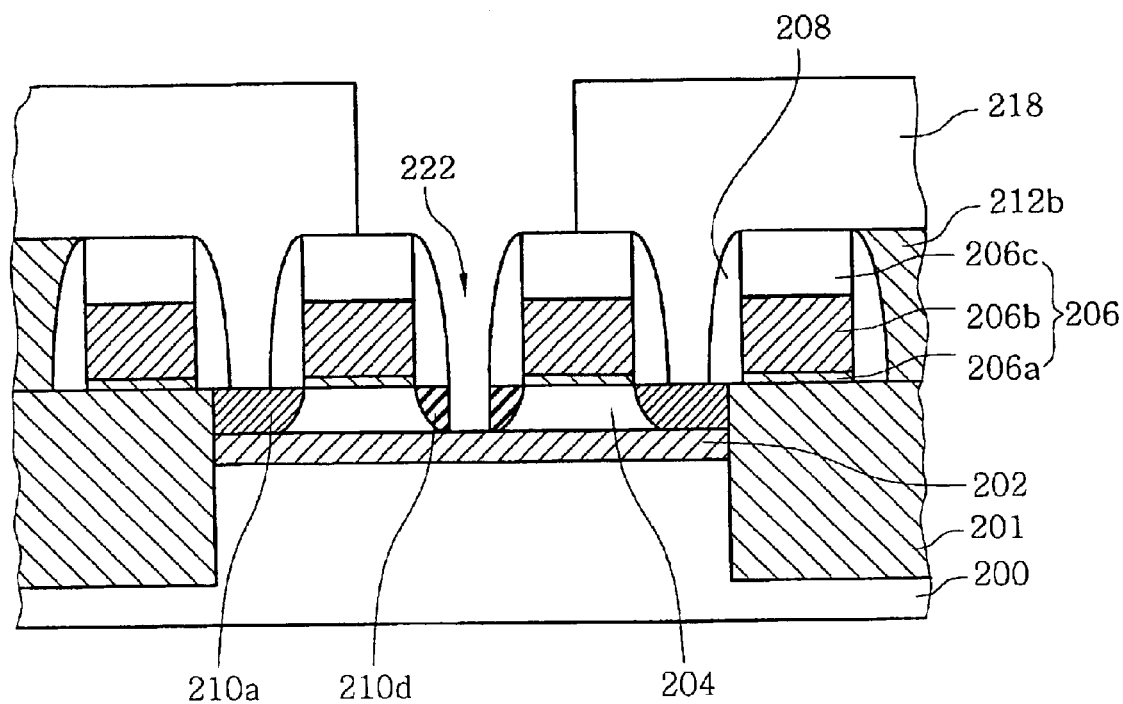

As shown in FIG. 5H, a third contact hole 222 is formed to expose the underlying silicon-germanium film 202 by selectively etching the silicon film 204 including the drain region 210d exposed between the nitride spacers 208. The second photoresist pattern 218 may then be removed.

Figure 5I:
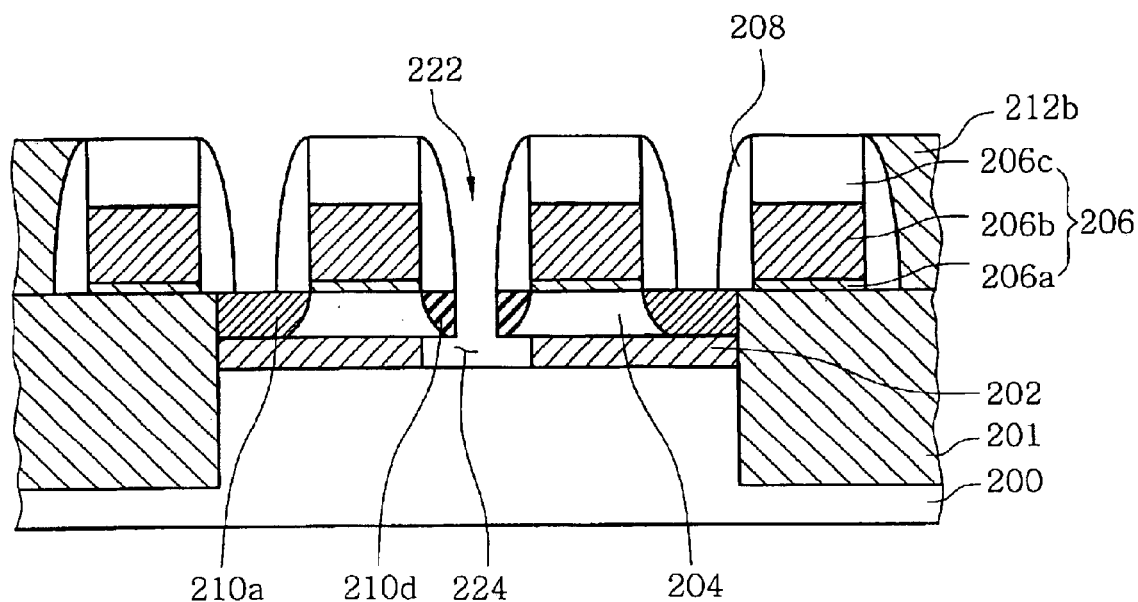

Referring to FIG. 5I, the portion of the silicon-germanium film 202 exposed through the third contact hole 222 is selectively etched such that a hole 224 is formed to extend from the exposed portion of the silicon-germanium film 202 in the vertical (downward) and lateral directions with respect to the substrate 200. Hence, the bottom portion of the drain region 210d is positioned at the upper portion of the hole 224. The etching process for the silicon-germanium film 202 may be accomplished under conditions such that the silicon-germanium film 202 is rapidly etched relative to the silicon substrate 200. In particular embodiments, the silicon-germanium film 202 is etched with an etching rate more than about five times faster than that of the silicon substrate 200. The silicon-germanium film 202 can be etched utilizing a dry etching process or a wet etching process. The hole 224 preferably extends toward but not to the source region 210a and, in some embodiments extends to and/or past an end portion of the gate structure 206 adjacent to the drain region 210d along the horizontal (lateral) direction with respect to the substrate 200.

Figure 5J:
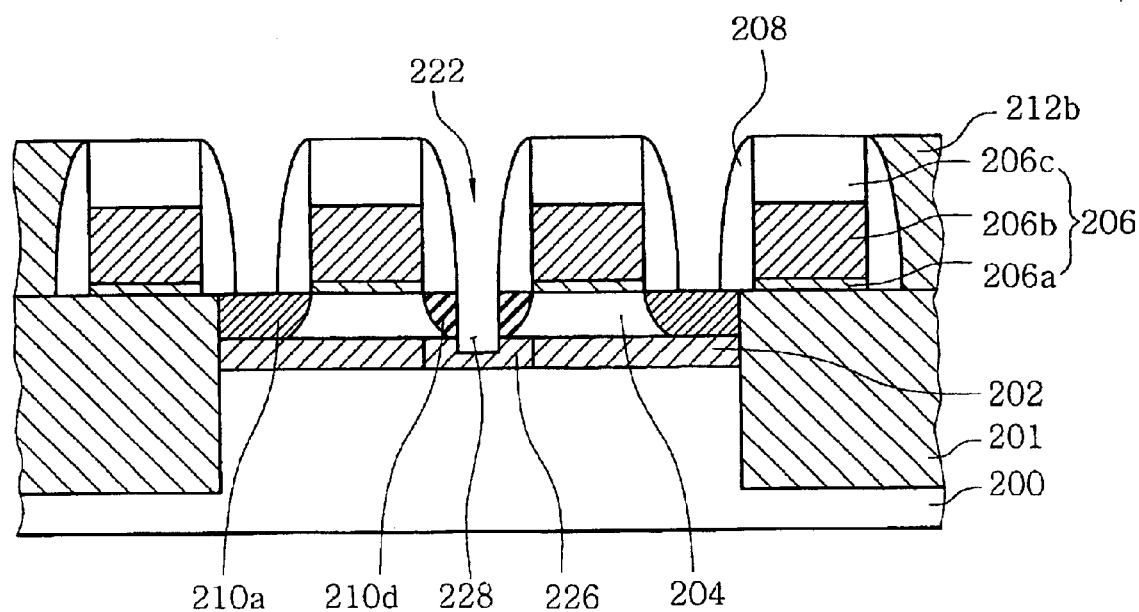

Referring to FIG. 5J, a silicon oxide film 226 is formed in the hole 224. The silicon oxide film 226 can be formed through a thermal oxidation process. If a thermal oxidation process is used, the silicon oxide film 226 may be formed, not only in the hole 224, but also on the side portions of the drain region 210d. Therefore, the silicon oxide film 226 is anisotropically etched to form a third contact hole 228 such that a portion of the silicon oxide film 226 remains beneath the drain region 210d. The third contact hole 228 exposes side portions of the nitride spacer 208 and the drain region 210d. The remaining portions of the silicon oxide film 226 are also exposed through the third contact hole 228.

Figure 5K:
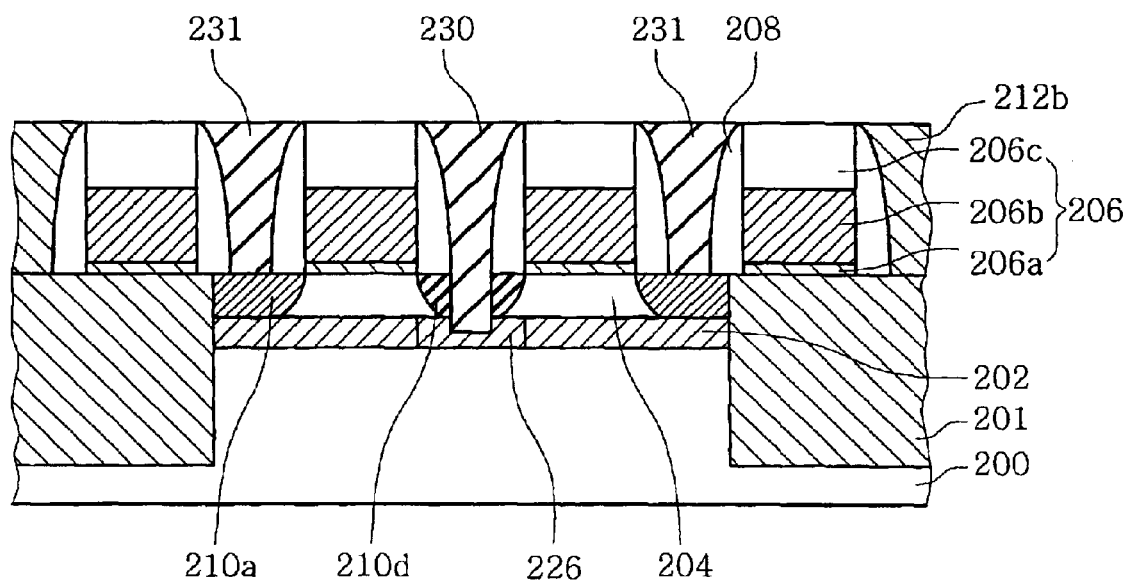

Referring to FIG. 5K, a conductive material is filled in the first and the third contact holes 216 and 228 to form pad electrodes 231 and 230 in the first and the third contact holes 216 and 222. The pad electrodes 231 and 230 make contact with the source and the drain regions 210a and 210d, respectively. More particularly, the pad electrodes 231 make contact with the upper face of the source region 210a and the pad electrode 230 makes contact with the side portion of the drain region 210d and the silicon oxide film 226. Because the drain region 210d is highly doped with impurities, the contact resistance between the drain region 210d and the pad electrode 230 can be reduced.

Figure 5L:
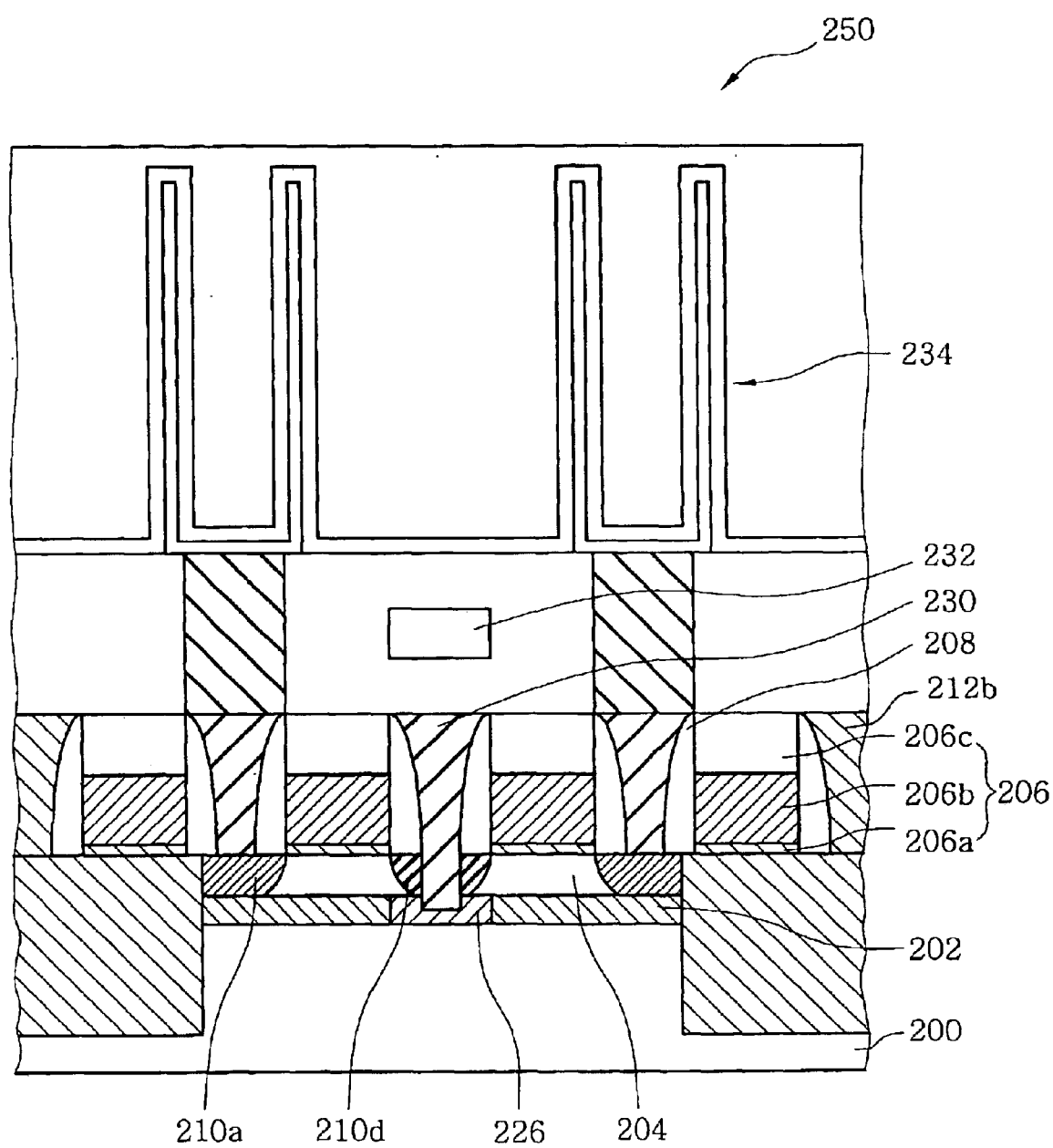

Referring to FIG. 5L, a semiconductor device 250 incorporating a transistor according to embodiments of the present invention may include a bit line 232 and a capacitor 234. The bit line 232 and the capacitor 234 may be formed on the resultant structure of FIG. 5K.

FIGS. 6A to 6M are cross-sectional views illustrating a method for forming a semiconductor device having a transistor according to further embodiments of the present invention. FIGS. 6A through 6M illustrate the formation of a semiconductor device including an NMOS transistor.

Figure 6A:
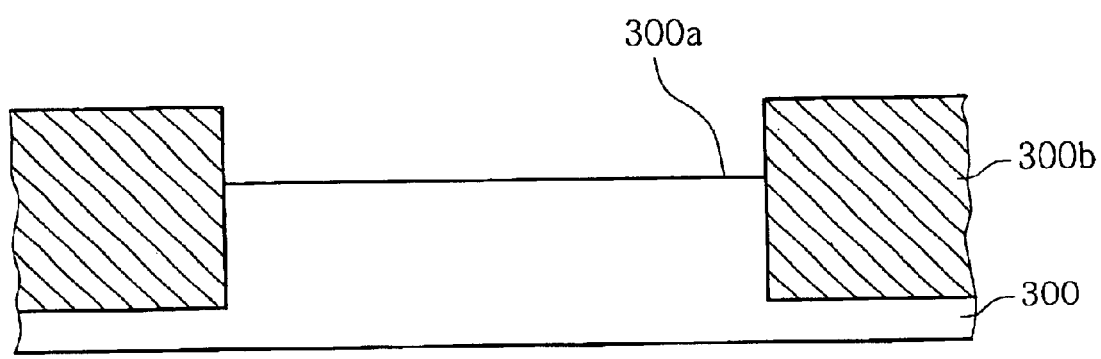
FIGS. 6A to 6M are cross-sectional views illustrating a method for forming the semiconductor device having the transistor according further embodiments of the present invention.

Referring to FIG. 6A, a silicon substrate 300 is divided into an active region 300a and a field region 300b by an isolation process. The active region 300a is lower than the field region 300b (i.e. the field region 300b extends beyond a surface of the active region 300a). In some embodiments of the present invention, the isolation process may be a LOCOS process or a trench isolation process. In the present example of embodiments illustrated in FIG. 6A, the active and the field regions 300a and 300b are formed by a trench isolation process. In particular, after a trench is formed in the substrate 300 by etching the portion of the substrate 300 corresponding to the field region 300b, a silicon oxide film is formed on the substrate 300 to cover the trench. Then, the silicon oxide film is chemically-mechanically polished so that the silicon oxide film remains only in the trench, while other portions of the silicon oxide film are removed to expose the silicon substrate 300. Subsequently, the exposed silicon substrate 300 is selectively etched to a depth of approximately 300 to 1,500 Å to provide the active area 300a. The silicon substrate 300 may, for example, be etched using an HCl gas or the mixture of a $Cl_2$ gas and an $H_2$ gas at a temperature of approximately 600 to 800° C.

Alternatively, after a trench is formed in the silicon substrate 300 by etching the portion of the substrate 300 corresponding to the field region 300b, a silicon oxide film is formed on the substrate 300 to cover the trench. A chemical-mechanical polishing (CMP) process may then be performed such that the silicon substrate 300 is more rapidly etched the silicon oxide film. The CMP process can be accomplished by controlling the polishing time and utilizing a slurry having etching selectivity. The silicon substrate 300 exposed as a result of the polishing process is lower than the silicon oxide film that fills the trench. The CMP process may be continued until the height difference between the substrate 300 and the silicon oxide film is approximately 300 to 1,500 Å.

Figure 6B:
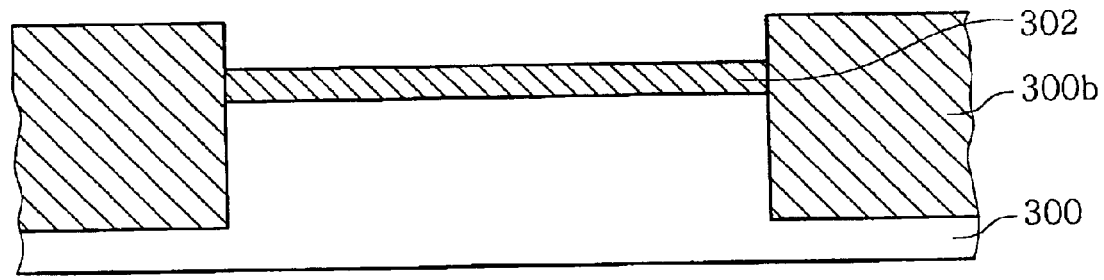

Referring to FIG. 6B, a silicon oxide film 302 is selectively formed in the active region 300a. The silicon oxide film 302 can be formed through a thermal oxidation process or a chemical vapor deposition process. The silicon oxide film 302 has a height of about 30% to 70% the height difference between the active region 300a and the field region 300b. Thus, the field region 300b still extends past the active region 300a and the silicon oxide film 302 in the active region 300a.

Figure 6C:
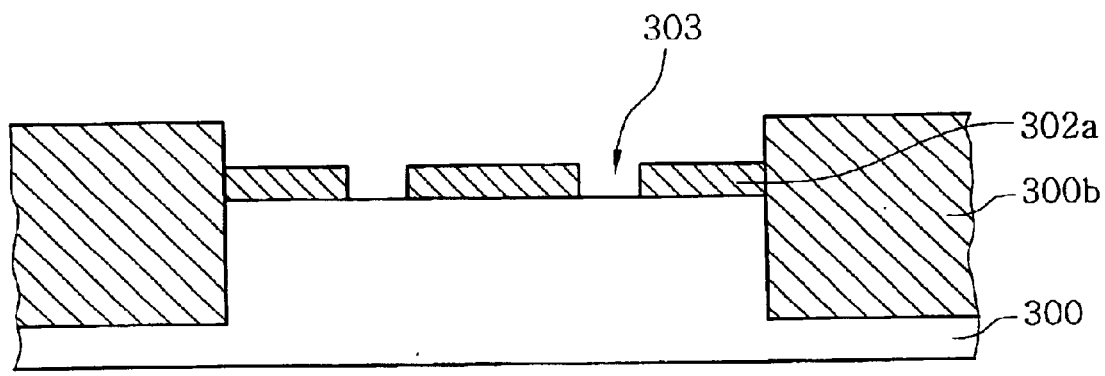

Referring to FIG. 6C, the predetermined portions of the silicon oxide film 302a are etched to expose portions of the substrate 300 beneath the silicon oxide film 302. The etched portions of the silicon oxide film 302a correspond to the channel regions of a MOS transistor formed through successive processes. In addition, the widths of the etched portions of the silicon oxide film 302a may be about 80% to 120% of the widths of the channel regions (that is, the lengths of gate electrodes). In particular, a photoresist pattern may be formed over the silicon oxide film 302a to open portions of the silicon oxide film 302a corresponding to the channel regions of the MOS transistor. The widths of the opened portions of the photoresist pattern may be about 80% to 120% of the widths of the channel regions. Then, after the silicon oxide film 302a exposed by the photoresist pattern is etched to expose the silicon substrate 300, the photoresist pattern is removed. Hereinafter, the exposed portions of the silicon substrate 300 are referred to as seed open regions 303 (see FIG. 6C).

Figure 6D:
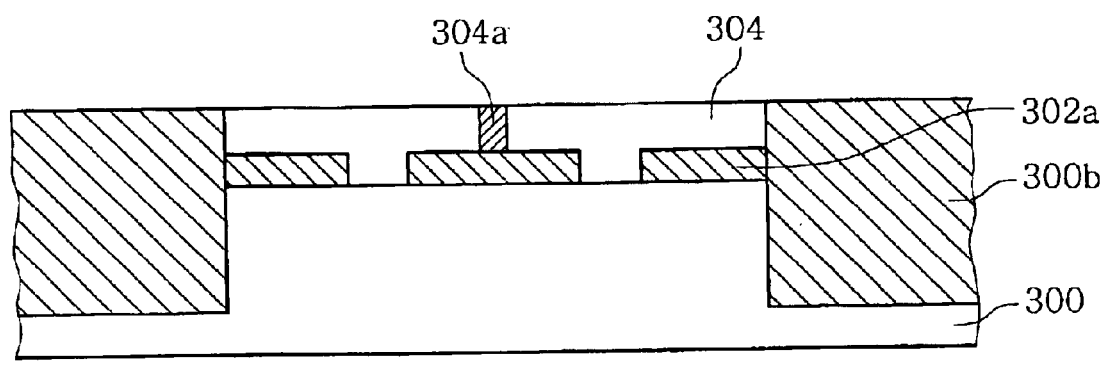

Referring to FIG. 6D, a silicon film 304 is formed through an epitaxial growth process using the exposed portions of the silicon substrate 300 as seeds. During the epitaxial growth process, crystals continuously grow from the lateral portions of the seed open regions 303 such that the silicon film 304 is formed from the seed open regions 303 to the upper face of the field region 300b. The silicon film 304 formed by the epitaxial growth process may have a crystal structure that is identical to that of the silicon substrate 300. However, the silicon film 304 may also include a defective epitaxial region 304a that has a crystal structure different from that of the silicon substrate 300. Such may be the case because the crystals grown from the lateral portions of the seed open regions 303 have different crystal structures in the defective epitaxial region 304a. In particular, the crystal structure of the silicon film 304 may be uniform in the defective epitaxial region 304a. Because the seed open regions 303 are positioned on the channel regions of the MOS transistor, the defective epitaxial region 304a corresponds to a source region or a drain region of the MOS transistor.

The silicon film 304 is polished until the silicon oxide film in the trench of the field region 300b is exposed so that the silicon film 304 has an even surface.

Figure 6E:
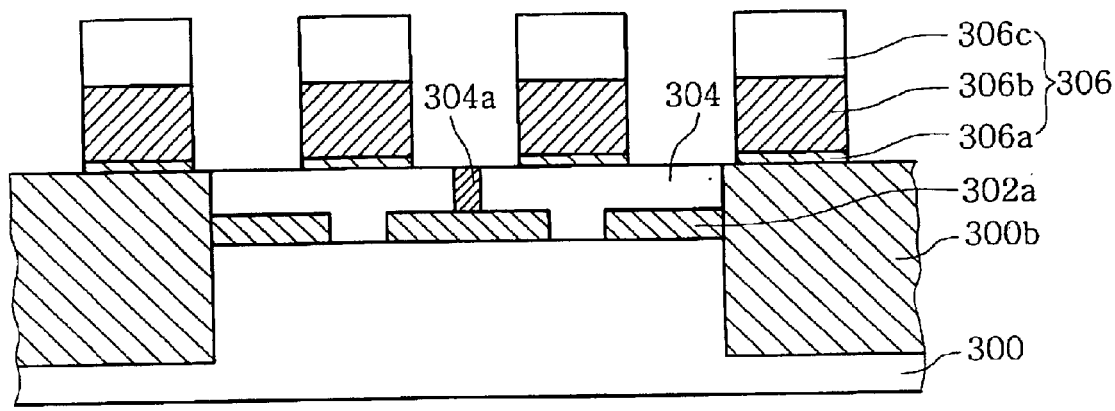

Referring to FIG. 6E, gate structures 306 are formed on the field region 300b and on the silicon film 304. Each of the gate structures 306 may have a gate oxide film pattern 306a, a polysilicon pattern 306b, and a nitride pattern 306c. Thus, the defective epitaxial region 304a may be positioned in the drain region between the gate structures 306.

In particular embodiments of the present invention, a gate oxide film is formed on the field region 300b and the silicon film 304 such that the gate oxide film has a thickness of approximately 50 to 150 Å. Then, a polysilicon film doped with an N-typed impurity is formed on the gate oxide film to have a thickness of approximately 1,000 to 1,500 Å. As discussed below, the polysilicon film will be patterned to form polysilicon patterns 306b serving as gate electrodes. To reduce the resistance in the gate electrode, a tungsten (W) film, a tungsten silicide ($WSi_x$) film, a titanium silicide ($TiSi_x$) film or a tantalum silicide ($TaSi_x$) may be formed on the polysilicon film. Subsequently, a nitride film is formed on the polysilicon film.

After a photoresist pattern (not shown) is formed to define portions of the nitride film where the gate electrodes are positioned, portions of the nitride film, the polysilicon film and the gate oxide film are successively etched. The photoresist pattern is removed through a plasma etching process and a stripping process with sulfuric acid, thereby forming the gate structures 306 each including the gate oxide pattern 306a, the polysilicon pattern 306b, and the nitride pattern 306c.

Figure 6F:
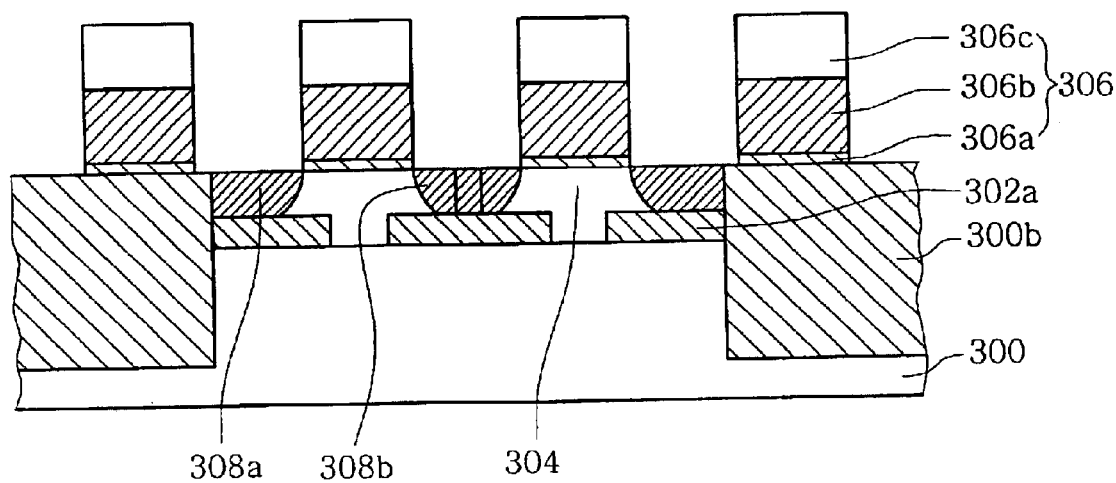

Still referring to FIG. 6F, N-type impurities are implanted into the silicon film 304 using the gate structures 306 as masks so that the source region 308a and the drain region 308b are formed in the silicon film 304. The N-type impurities are implanted to a bottom portion of the silicon film 204 adjacent the silicon-oxide film 302a.

Figure 6G:
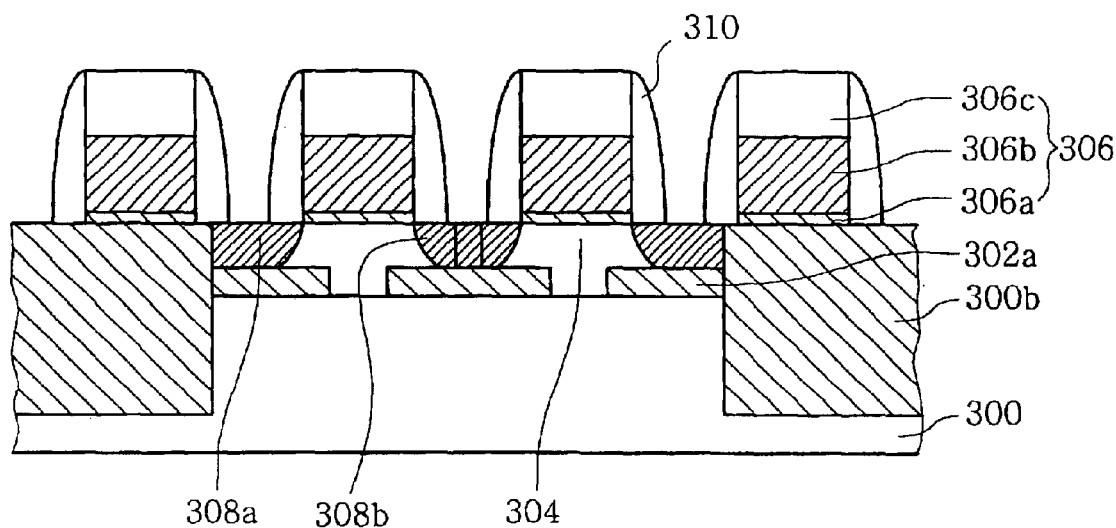

Referring to FIG. 6G, after a nitride film is blanket formed on the silicon film 304 and the gate structures 306, the nitride film is anisotropically etched to remain only on the sidewalls of the gate structures 306, thereby forming spacers 310 on the sidewalls of the gate structures 306.

Figure 6H:
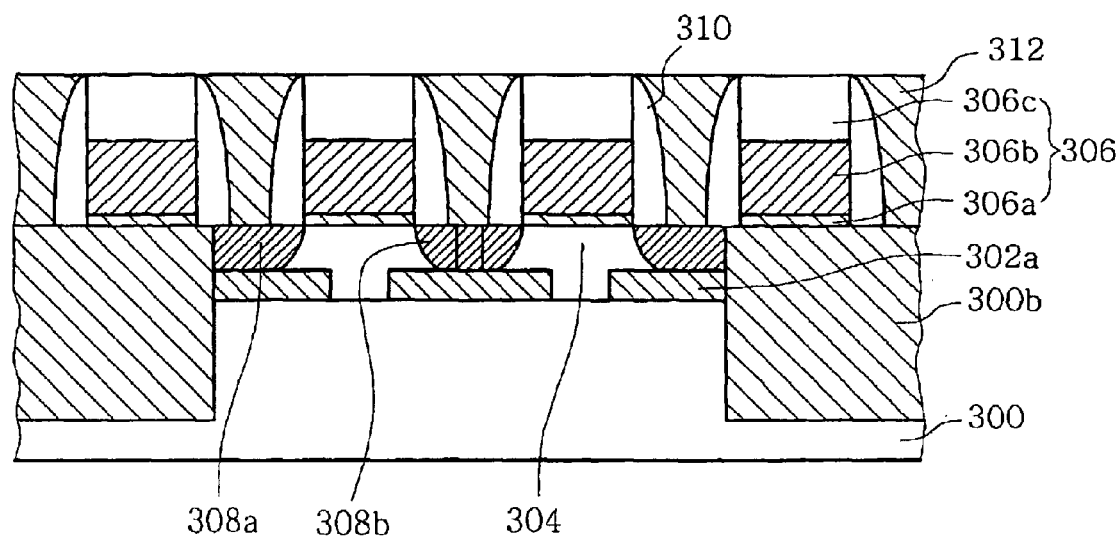

Referring to FIG. 6H, an insulation film 312 is formed on the silicon film 304 to cover the gate structures 306. The insulation film 312 is formed so as to fill the gap and be completely buried between the gate structures 306. Then, the surface of the insulation film 312 is polished such that the insulation film 312 has an even surface.

Figure 6I:
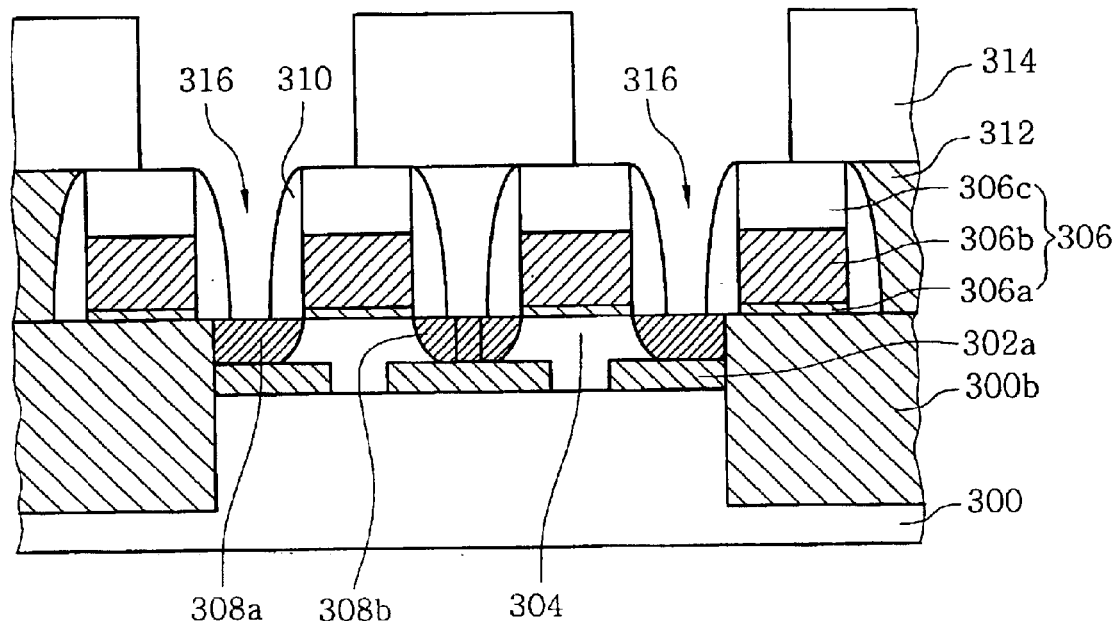

Referring to FIG. 6I, a first photoresist pattern 314 is formed on the gate structures 306 to open the source regions 308a between the gate structures 306. Portions of the insulation film 312 between the gate structures 306 are etched using the first photoresist pattern 314 as an etching mask such that first contact holes 316 are formed to partially expose the source regions 308a. The first contact holes 316 may be formed through a self-aligning process utilizing the etching selectivity between the insulation film 312 and the nitride spacers 310. Then, the first photoresist pattern 314 is removed.

Figure 6J:
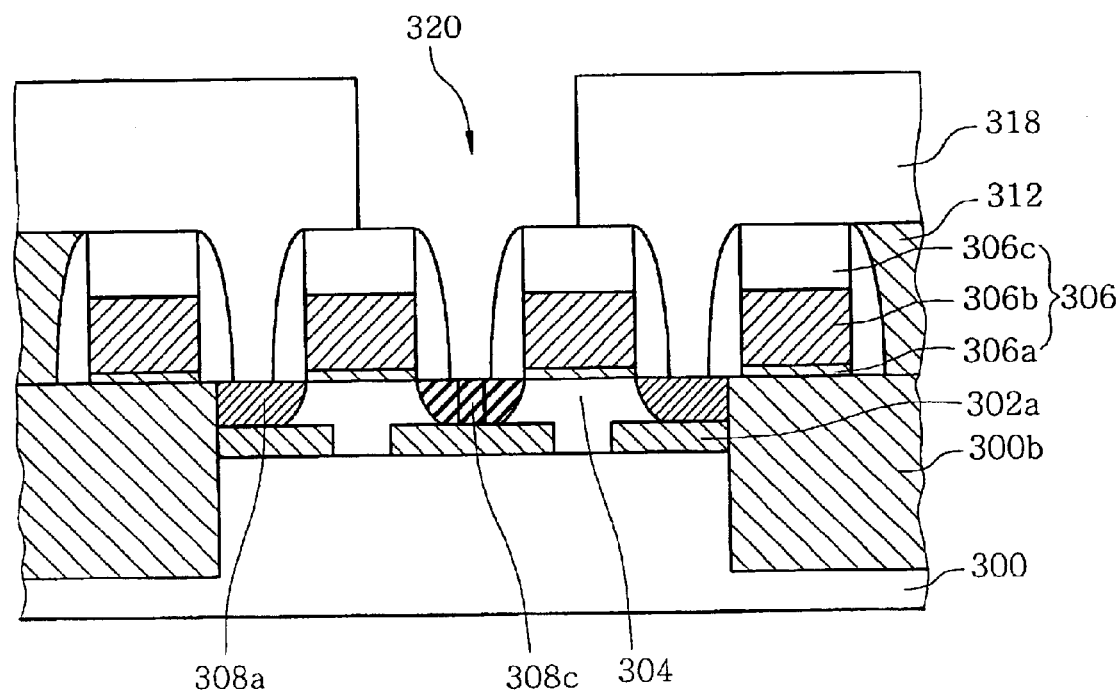

Referring to FIG. 6J, a second photoresist pattern 318 is formed on the gate structures 306 to open the drain region 308c between the gate structures 306. The second photoresist pattern 318 is formed to fill the first contact holes 316. Then, the portion of the insulation film 312 between the gate structures 306 is etched using the second photoresist pattern 318 as an etching mask so that a second contact hole 320 is formed to partially expose the drain region 308c. The second contact hole 320 may be formed through a self-aligning process utilizing the etching selectivity between the insulation film 312 and the nitride spacers 310.

Subsequently, an N-type impurity is additionally implanted into the drain region 308c exposed through the second contact hole 320. Because the N-type impurity is additionally implanted into the drain region 308c, the drain region 308c has a higher impurity concentration than the source region 308a. In particular embodiments of the present invention, the impurity can be implanted into the drain region 308c with the energy of approximately 1 to 50 KeV. With such energy, the damage of the substrate 300 may be reduced and/or minimized during the impurity implanting process while the impurity concentration of the drain region 308c may be made higher than that of the source region 308a.

Figure 6K:
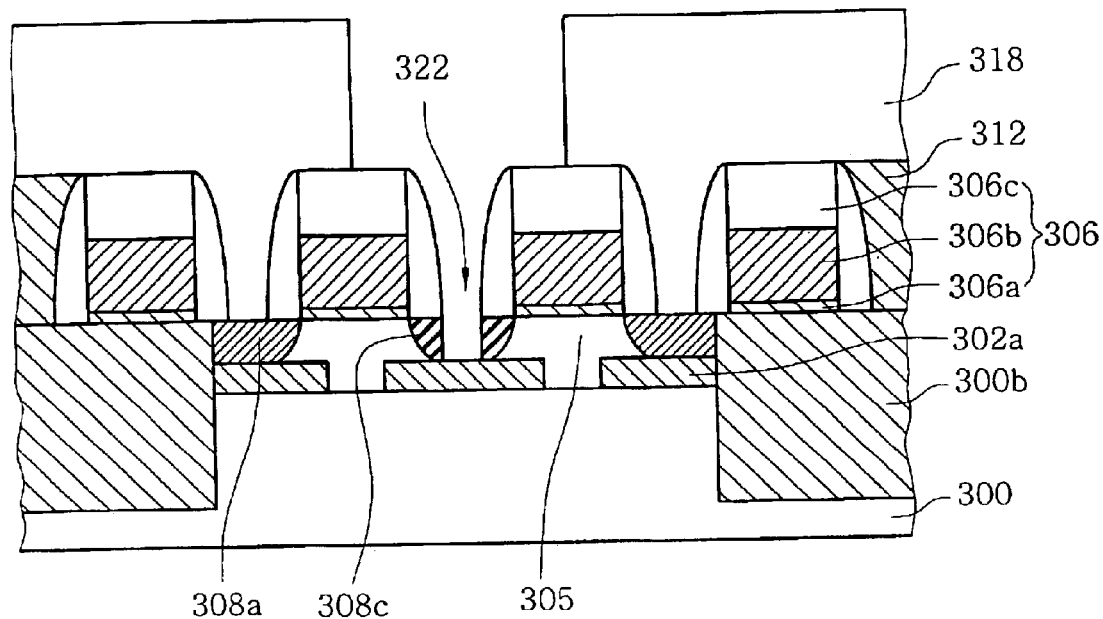

As shown in FIG. 6K, a third contact hole 322 is formed to expose the underlying silicon film 302a by selectively etching the silicon film 305 including the drain region 308c exposed between the nitride spacers 310. During the formation of the third contact hole 322, the defective epitaxial region 304a of the silicon film 305 may be partially or completely removed. Thus, the remaining silicon film 305 may have a crystal structure identical to that of the silicon substrate 300. The second photoresist pattern 318 is then removed.

Figure 6L:
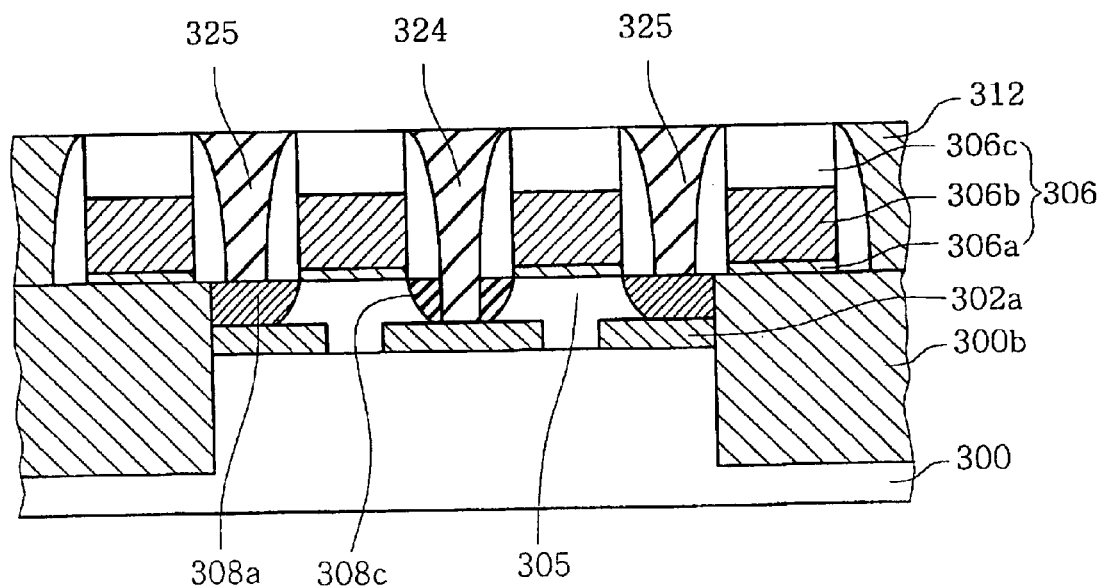

Referring to FIG. 6L, a conductive material is filled in the first and the third contact holes 316 and 322 so that pad electrodes 324 and 325 are formed in the first and the third contact holes 316 and 322. The pad electrodes 325 make contact with the source regions 308a. The pad electrode 324 makes contact with the drain regions 308c. In particular, the pad electrodes 325 make contact with the upper face of the source region 308a. The pad electrode 324 makes contact with the side portion of the drain region 308c and the bottom face of the pad electrode 324 makes contact with the silicon oxide film 302a.

Figure 6M:
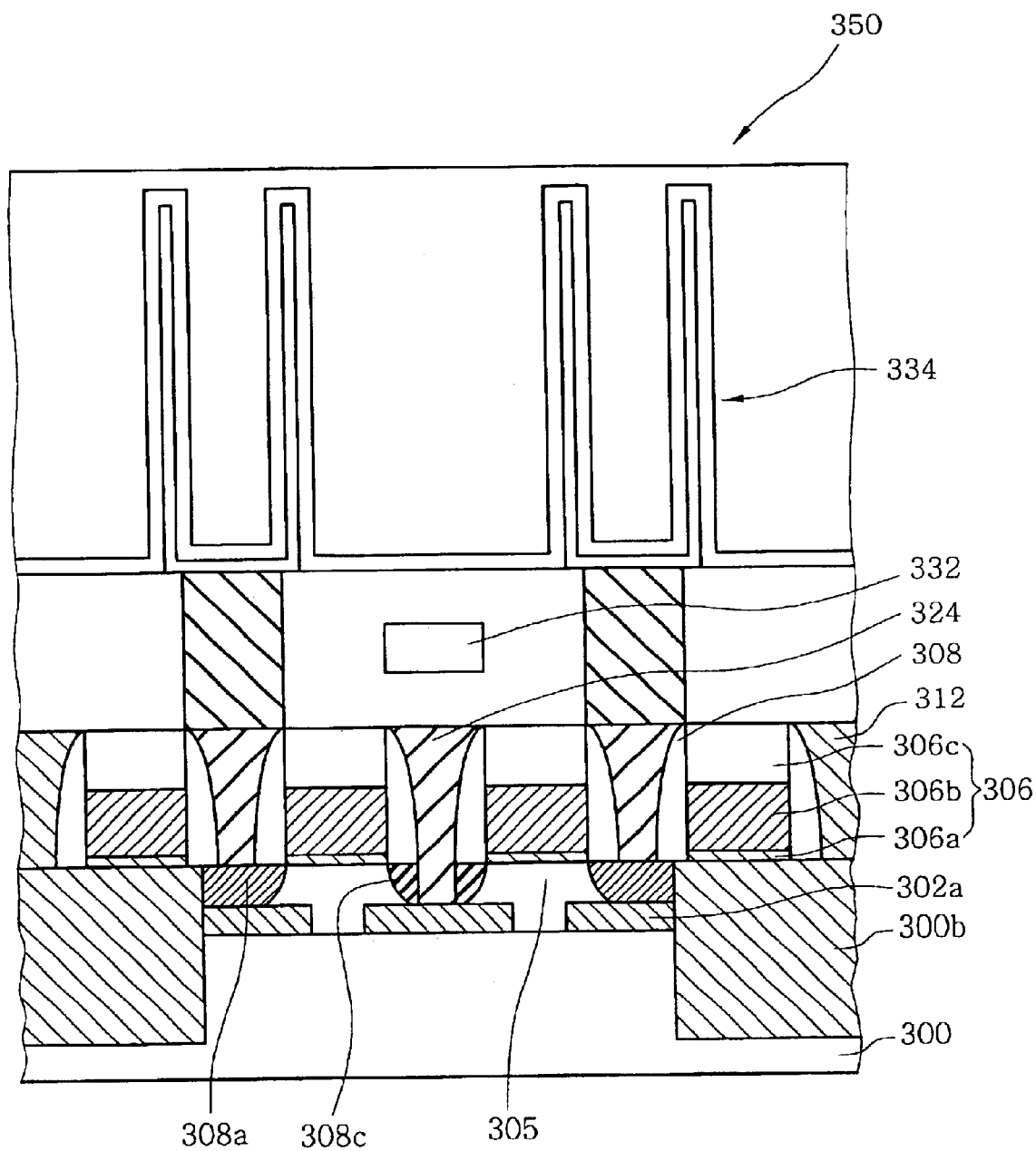

Referring to FIG. 6M, a semiconductor device 350 incorporating a transistor according to embodiments of the present invention may include a bit line 332 and a capacitor 334. The bit line 332 and the capacitor 334 may be formed on the resultant structure of FIG. 6L.

FIGS. 7A to 7K are cross-sectional views illustrating methods for forming a semiconductor device including a transistor according to additional embodiments of the present invention. FIGS. 7A through 7K illustrate the formation of a semiconductor device having an NMOS transistor.

Figure 7A:
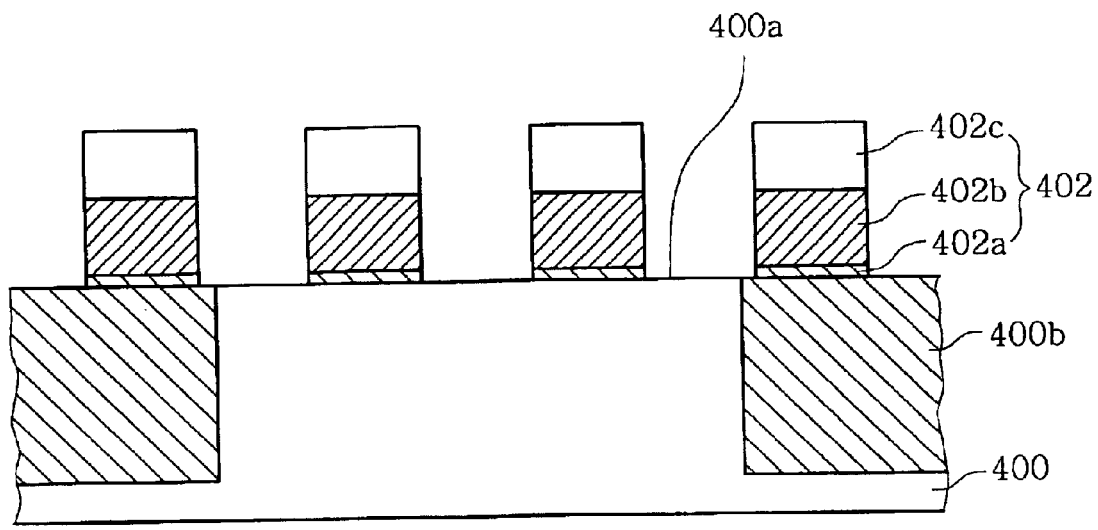
FIGS. 7A to 7K are cross-sectional views illustrating a method for forming the semiconductor having the transistor according to further embodiments of the present invention.

Referring to FIG. 7A, a silicon substrate 400 is divided into an active region 400a and a field region 400b through an isolation process. Gate structures 402 are formed in the active region 400a. In particular embodiments of the present invention, the gate structures 402 include a gate oxide pattern 402a, a polysilicon pattern 402b and a nitride pattern 402c. In certain embodiments of the present invention, after a gate oxide film is coated on the silicon substrate 400 to a thickness of approximately 50 to 150 Å, a polysilicon film doped with an N-typed impurity is formed on the gate oxide film so that the polysilicon film has a thickness of approximately 1,000 to 1,500 Å. The polysilicon film serves as the gate electrode of the MOS transistor. To reduce the resistance in the gate electrode, a tungsten (W) film, a tungsten silicide ($WSi_x$) film, a titanium silicide ($TiSi_x$) film or a tantalum silicide ($TaSi_x$) may be formed on the polysilicon film. A nitride film may be formed on the polysilicon film.

After a photoresist pattern (not shown) is formed to define portions of the nitride film where the gate electrodes are positioned, portions of the nitride film, the polysilicon film and the gate oxide film are successively etched. The photoresist pattern is removed through a plasma etching process and a stripping process with sulfuric acid, thereby forming the gate structures 402 each including the gate oxide pattern 402a, the polysilicon pattern 402b, and the nitride pattern 402c.

Figure 7B:
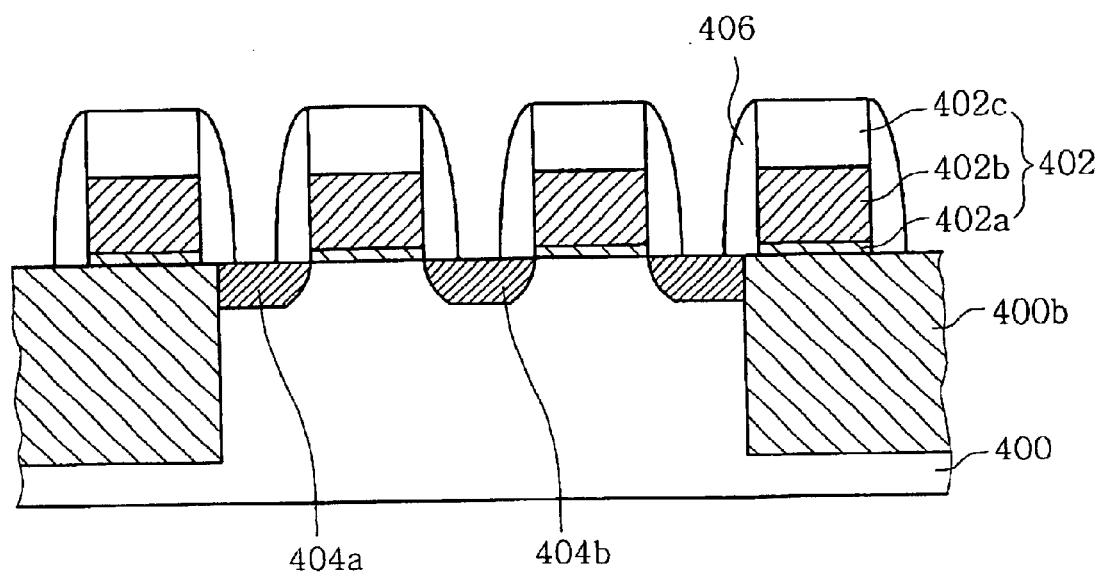

Referring to FIG. 7B, N-type impurities are implanted into the silicon substrate 400 using the gate structures 402 as masks such that a source region 404a and a drain region 404b are formed on the silicon substrate 400. A nitride film is formed on the substrate 400 on which the gate structures 402 are formed and the nitride film is anisotropically etched to remain on sidewalls of the gate structures 402 so that nitride spacers 406 are formed on the sidewalls of the gate structures 402.

Figure 7C:
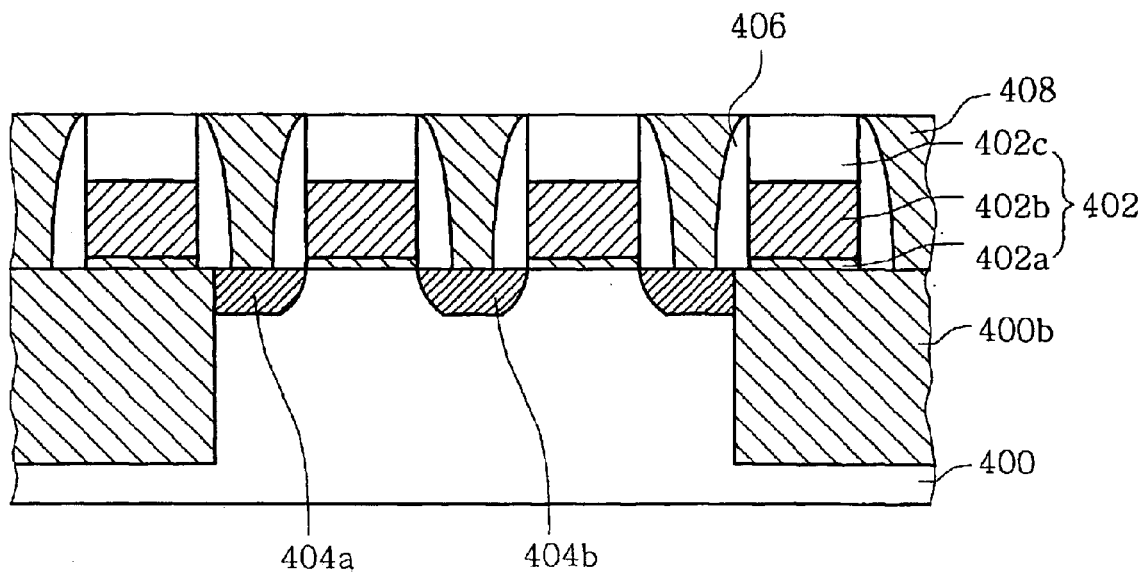

Referring to FIG. 7C, an insulation film 408 is formed on the silicon substrate 400 to cover the gate structures 402. The insulation film 408 is formed so as to fill the gap and be completely buried between the gate structures 402. Then, the surface of the insulation film 408 is polished such that the insulation film 408 has an even surface.

Figure 7D:
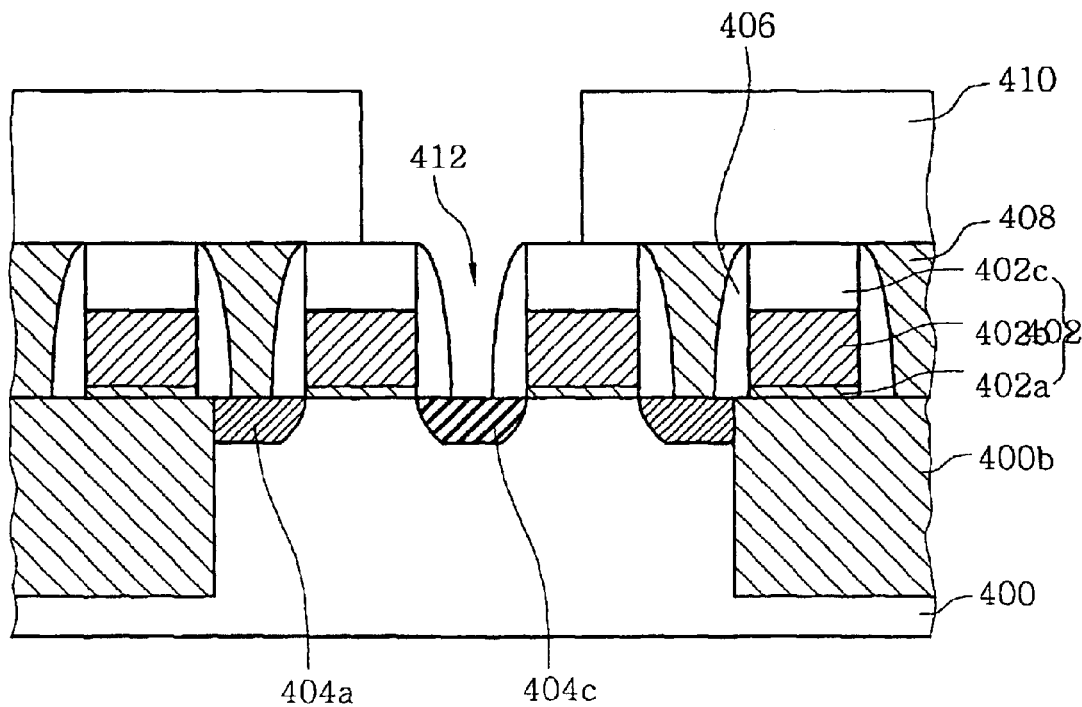

Referring to FIG. 7D, a first photoresist pattern 410 is formed on the gate structures 402 to open the drain regions 404c between the gate structures 402. The portion of the insulation film 408 between the gate structures 402 is etched using the first photoresist pattern 410 as an etching mask so that a first contact hole 412 is formed to partially expose the drain region 404c. In certain embodiments of the present invention, the first contact hole 412 may be formed through a self-aligning process utilizing the etching selectivity between the insulation film 408 and the nitride spacers 406.

An additional N-type impurity is implanted into the drain region 404c exposed through the first contact hole 412. Because the N-type impurity is additionally implanted into the drain region 404c, the drain region 404c has a higher impurity concentration than the source region 404a. In particular embodiments of the present invention, the impurity can be implanted into the drain region 404c with the energy of approximately 1 to 50 KeV. With such energy, the damage of the substrate 400 may be reduced and/or minimized during the impurity implanting process while the impurity concentration of the drain region 404c may be made higher than that of the source region 404a.

Figure 7E:
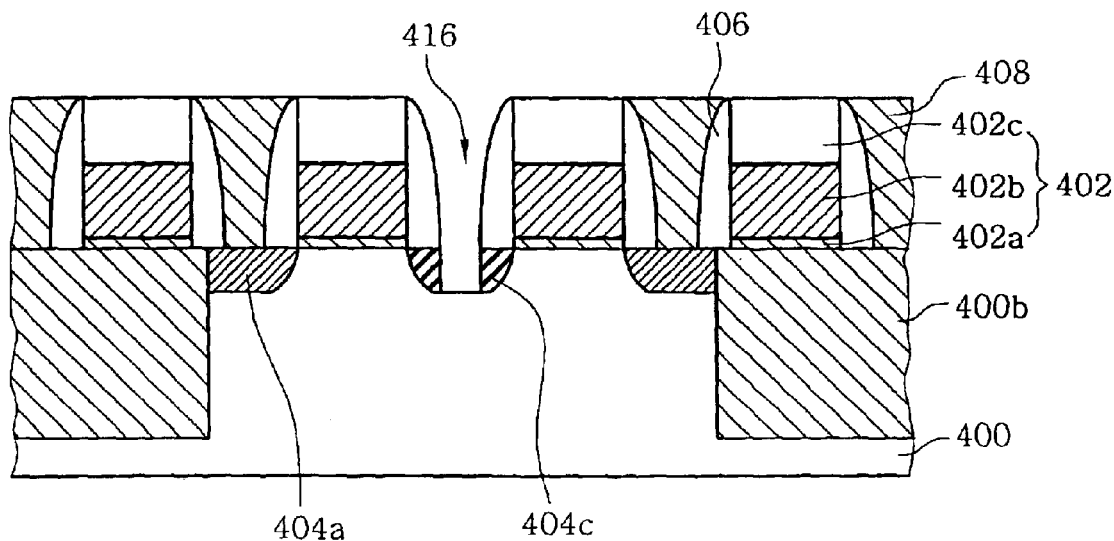

Referring to FIG. 7E, a second contact hole 416 is formed to the bottom face of the drain region 404c by selectively etching the portion of the silicon substrate 400 including the drain region 404c exposed between the nitride spacers 406. The lateral portions of the nitride spacer 406 and the drain region 404c are exposed through the second contact hole 416.

Figure 7F:
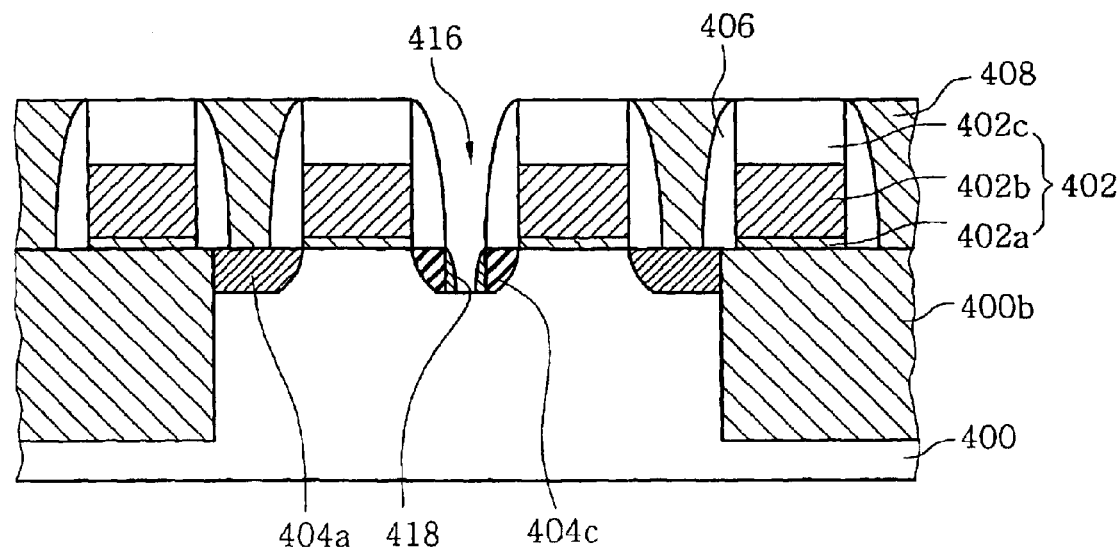

Referring to FIG. 7F, a spacer 418 is formed on the lateral portion of the drain region 404c exposed in the second contact hole 416. The spacer 418 may include a material having etching selectivity relative to the silicon substrate 400. For example, the spacer 418 may be silicon oxide or silicon oxy-nitride. In particular embodiments of the present invention, a silicon oxide film is blanket formed on the silicon substrate 400 including the second contact hole 416 such that the silicon oxide film has a thickness of approximately 50 to 500 Å. The silicon oxide film is anisotropically etched to form the spacer 418 on the lateral portion of the drain region 404c exposed through the second contact hole 416. The spacer 418 should cover the drain region 404c to prevent the lateral portion of the drain region 404c from being exposed in a subsequent etch.

Figure 7G:
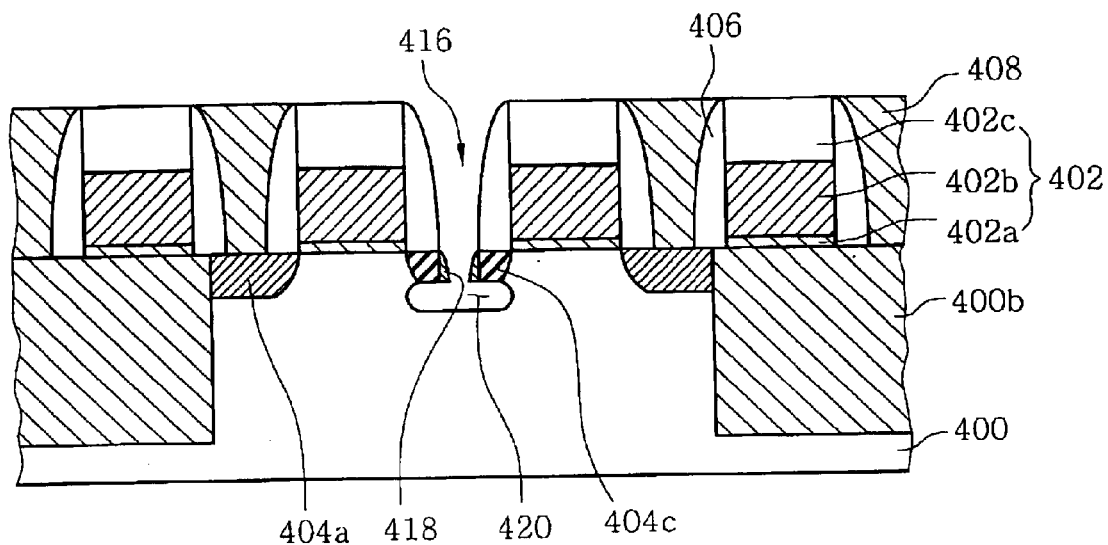

Referring to FIG. 7G, a hole 420 is formed by selectively etching the portion of the silicon substrate 400 through the second contact hole 416. The hole 420 formed in the substrate 400 extends in the vertical (or downwards) and the horizontal (or lateral) directions with respect to the silicon substrate 400 and extends under the second contact hole 416. Thus, the bottom face of the drain region 404c is positioned over the hole 420. The etching process for forming the hole 420 may be accomplished under conditions such that the substrate 400 is rapidly and selectively etched relative to the silicon oxide spacer 418. For example, the etching process may be carried out using an HCl gas or a mixture of a $Cl_2$ gas and an $H_2$ gas at a temperature of approximately 600 to 800° C. The etching process may be carried out for a time sufficient for the hole 420 to extend to a portion of the substrate 400 to the end of the drain region 404c adjacent the gate structures 402. A silicon oxide film is filled in the hole 420.

Figure 7H:
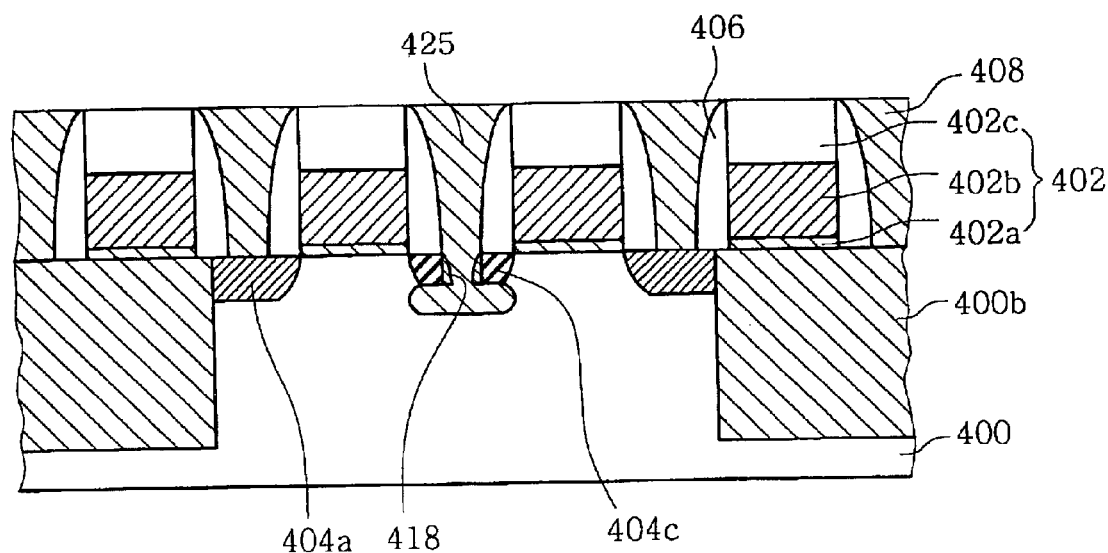

Referring to FIG. 7H, the hole 420 may be filled with the silicon oxide film 425 through the thermal oxidation process. The silicon oxide spacer 418, formed on the lateral portion of the drain region 404c, prevents the drain region 404c from being oxidized. The silicon oxide film 425 may be formed between the gate structures 402 to fill up the spaces between the gate structures 402.

Figure 7I:
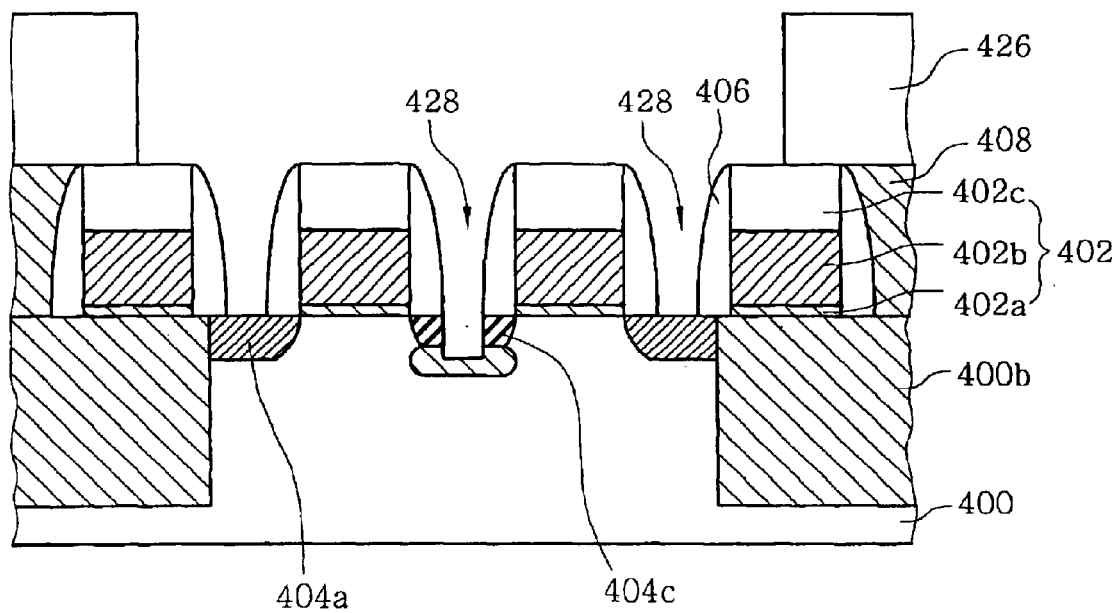

Referring to FIG. 7I, a photoresist pattern 426 is formed on the gate structures 402 and on the silicon oxide film 425 so that the photoresist film 426 opens the source and the drain regions 404a and 404c between the gate structures 402. Subsequently, the insulation and the silicon oxide films 408 and 425 formed between the gate structures 402 are etched using the photoresist pattern 426 as an etching mask, thereby forming third contact holes 428 exposing the upper face of the source region 404a and the lateral portion of the drain region 404c, respectively. The etching process for forming the third contact holes 428 can be carried out under conditions in which the insulation and the silicon oxide films 408 and 425 may be rapidly and selectively etched relative to the nitride spacers 406. Also, with such etching process, the silicon oxide film 425 in the hole 420 may be partially removed while the silicon substrate 400 where the source region 404a is positioned may only be slightly etched.

Figure 7J:
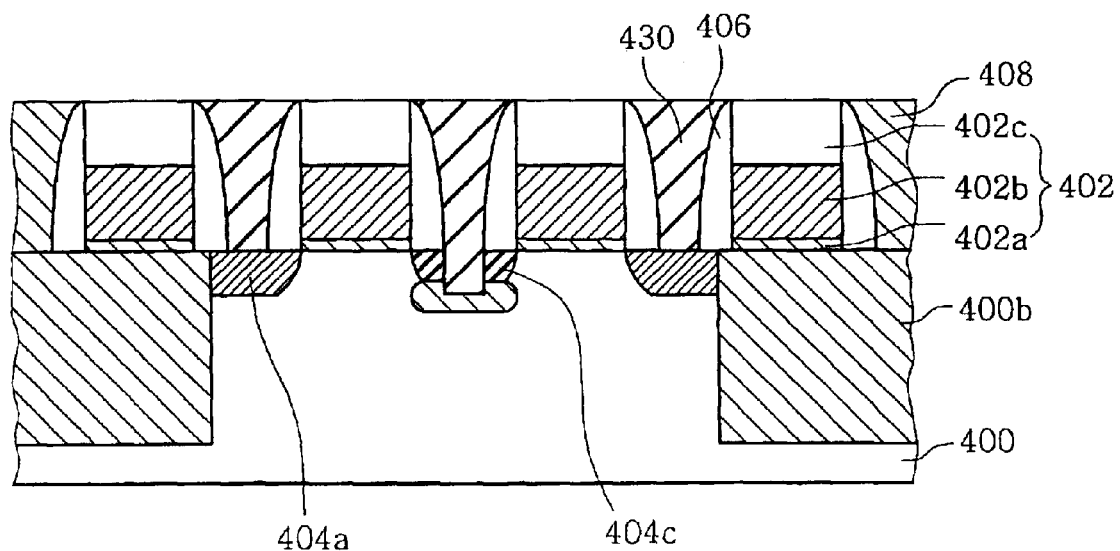

Referring to FIG. 7J, contact materials are filled in the third contact holes 428 such that pad electrodes 430 are formed to make contact with the source and the drain regions 404a and 404c. The respective ones of the pad electrodes 430 make contact with the upper face of the source region 404a and the lateral portion of the drain region 404c and the the silicon oxide film 425 in the hole 420.

Figure 7K:
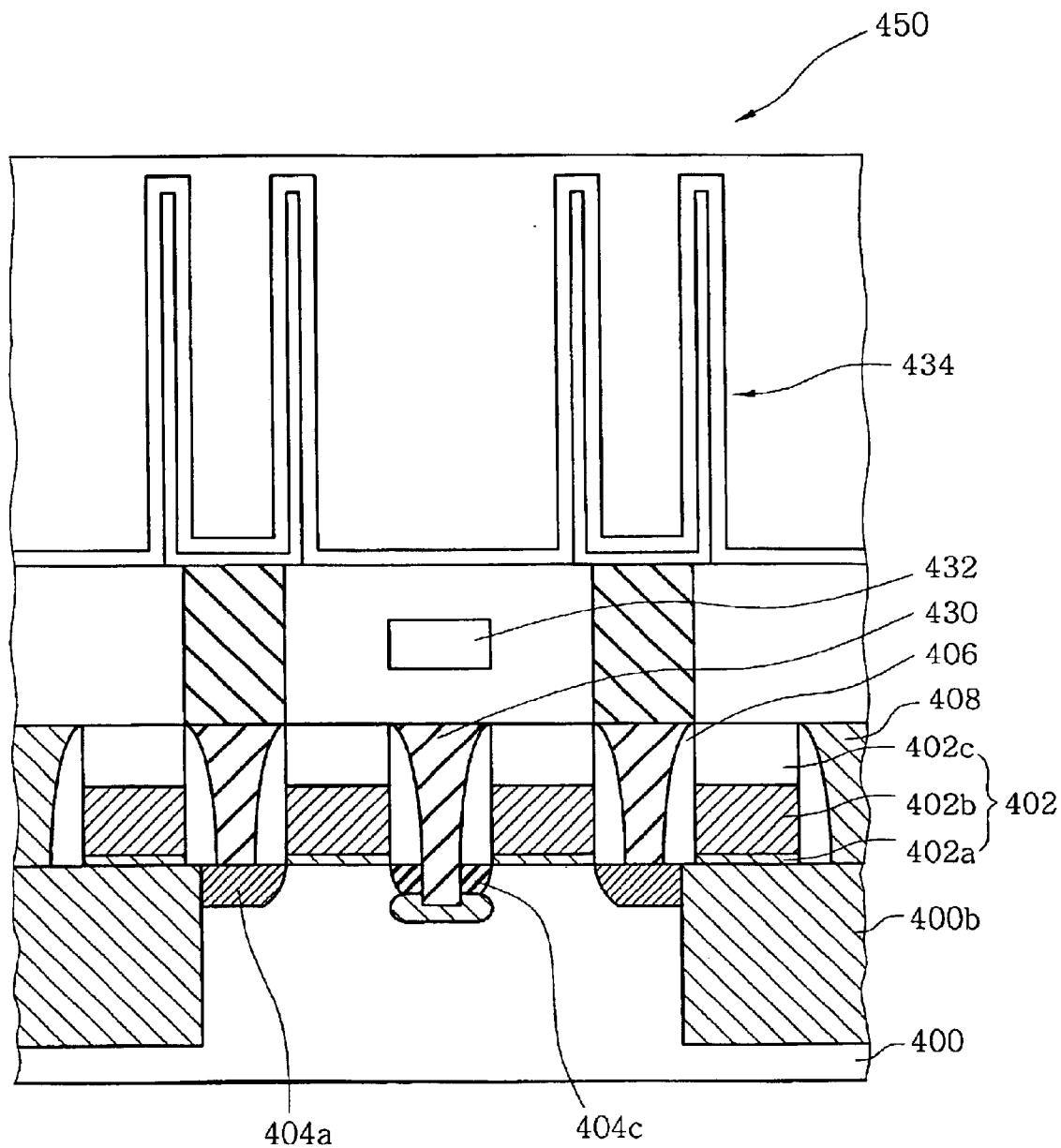

Referring to FIG. 7K, a semiconductor device 450 incorporating a transistor according to embodiments of the present invention may include a bit line 432 and a capacitor 434. The bit line 432 and the capacitor 434 may be formed on the resultant structure of FIG. 7J.

Although the preferred embodiments of the present invention have been described, it is understood that the present invention should not be limited to these preferred embodiments but various changes and modifications can be made by one skilled in the art within the spirit and scope of the present invention as hereinafter claimed.

That which is claimed is:

1. A metal oxide semiconductor transistor, comprising:
   a silicon well region having a first surface and having spaced apart source and drain regions therein;
   a gate insulator on the first surface of the silicon well region and disposed between the source and drain regions;
   a gate electrode on the gate insulator;
   a region of insulating material disposed between a first surface of the drain region and the silicon well region, wherein the region of insulating material extends toward but not to the source region;
   a source electrode that contacts the source region; and
   a drain electrode that contacts the drain region and the region of insulating material.

2. A method of forming a metal oxide semiconductor transistor, comprising:
   forming a silicon well region having a first surface and having spaced apart source and drain regions therein;
   forming a gate insulator on the first surface of the silicon well region and disposed between the source and drain regions;
   forming a gate electrode on the gate insulator;
   forming a region of insulating material disposed between a first surface of the drain region and the silicon well region, wherein the region of insulating material extends toward but not to the source region;
   forming a source electrode that contacts the source region; and
   forming a drain electrode that contacts the drain region and the region of insulating material.

3. The method of claim 2 wherein forming a region of insulating material comprises forming a region of silicon oxide.

4. The method of claim 2, further comprising forming a buried layer of silicon-germanium that is disposed within the silicon well region and extends beneath the gate insulator.

5. The method of claim 4, wherein forming a region of insulating material comprises forming a region of insulating material that makes contact with a side portion of the silicon-germanium buried layer.

6. The method of claim 2, wherein forming a drain region comprises forming a drain region having a higher impurity concentration than the source region.

7. The method of claim 2, wherein forming a drain electrode comprises forming a drain electrode that extends beyond the first surface of the silicon well region and into the silicon well region to contact the region of insulating material and contacts the drain region on a sidewall of the drain region.

8. The method of claim 2, wherein forming a region of insulating material comprises forming a region of insulating material that does not extend beneath the gate electrode.

9. The method of claim 2, wherein forming a region of insulating material comprises forming a region of insulating material that extends partially beneath the gate electrode.

10. A method for forming a metal oxide semiconductor transistor comprising:
    successively forming a silicon-germanium film and a silicon film on a silicon substrate;
    forming gate electrode structures on the silicon film wherein each of the gate electrode structures includes a gate oxide pattern and a conductive pattern;
    implanting impurities into the silicon film using the gate electrode structures as a mask so as to form source and drain regions;

forming nitride spacers on sidewalls of the gate electrode structures;
selectively etching the silicon film in the drain region exposed between the nitride spacers so as to expose the silicon-germanium film;
selectively etching the exposed silicon-germanium film so as to form a hole extending from the exposed silicon-germanium film in vertical and lateral directions with respect to the substrate; and
forming a silicon oxide film in the hole.

11. The method for forming a metal oxide semiconductor transistor of claim 10, further comprising selectively implanting an impurity into the drain region after forming the nitride spacers so as to provide a drain region with a higher impurity concentration than the source region.

12. The method for forming a metal oxide semiconductor transistor of claim 11, wherein the impurity is implanted at an energy of approximately 1 to 50 KeV.

13. The method for forming a metal oxide semiconductor transistor of claim 10, wherein the silicon-germanium film and the silicon film are formed via an epitaxial growth process.

14. The method for forming a metal oxide semiconductor transistor of claim 10, wherein the silicon-germanium film has a thickness of approximately 100 to 500 Å.

15. The method for forming a metal oxide semiconductor transistor of claim 10, wherein the silicon film has a thickness of approximately 200 to 500 Å.

16. The method for forming a metal oxide semiconductor transistor of claim 10, wherein an etching rate of the silicon-germanium film is at least about five times faster than an etching rate of the silicon film.

17. The method for forming a metal oxide semiconductor transistor of claim 10, wherein the silicon-germanium film is etched by one or both of a wet etching process and a dry etching process.

18. The method for forming a metal oxide semiconductor transistor of claim 10, wherein the hole is extended to one side portion of the gate electrode structure adjacent to the drain region during etching the silicon-germanium film.

19. The method for forming a metal oxide semiconductor transistor of claim 10, further comprising:
forming an insulation film covering the gate structures having the nitride spacers after forming the nitride spacers;
selectively etching a portion of the insulation film on the source region to partially expose an upper face of the source region;
etching a portion of the insulation film on the drain region to partially expose an upper face of the drain region; and
implanting an impurity into the exposed drain region.

20. The method for forming a metal oxide semiconductor transistor of claim 10, further comprising:
anisotropically etching a portion of the silicon oxide film formed in the hole to partially expose the drain region; and
deposting a conductive material to fill an area between the gate electrode structures so as to form pad electrodes making contact with the source and the drain regions, respectively.

21. A method for manufacturing a semiconductor device having a metal oxide semiconductor transistor comprising:
successively forming a silicon-germanium film and a silicon film on a silicon substrate;
forming gate electrode structures on the silicon film wherein each of the gate electrode structures includes a gate oxide pattern and a conductive pattern;
implanting impurities into the silicon film using the gate electrode structures as masks to form a source region and a drain region;
forming nitride spacers on sidewalls of the gate electrode structures;
forming an interlayer dielectric film on the nitride spacers wherein the interlayer dielectric film covers the gate electrode structures;
forming a first contact hole between the gate electrode structures by etching the interlayer dielectric film to partially expose first faces of the source and drain regions;
selectively etching a portion of the silicon film including the drain region exposed through the first contact hole to form a second contact hole exposing the silicon-germanium film;
selectively etching the exposed silicon-germanium film to form a third hole extending from the exposed silicon-germanium film in vertical and lateral directions with respect to the substrate; and
forming a silicon oxide film in the third hole.

22. The method for manufacturing a semiconductor device having a metal oxide semiconductor transistor of claim 21, further comprising selectively implanting an impurity into the drain region utilizing the first contact hole.

23. The method for manufacturing a semiconductor device having a metal oxide semiconductor transistor of claim 21, wherein the step for forming the first hole further comprises:
etching a portion of the interlayer dielectric film on the source region to partially expose the upper face of the source region;
etching a portion of the interlayer dielectric film on the drain region to partially expose the upper face of the drain region; and
selectively implanting an impurity into the exposed drain region.

24. The method for manufacturing a semiconductor device having a metal oxide semiconductor transistor of claim 21, wherein the silicon-germanium film and the silicon film are formed by a epitaxial growth process.

25. The method for manufacturing a semiconductor device having a metal oxide semiconductor transistor of claim 21, wherein an etching rate of the silicon-germanium film is at least about five times faster than that of the silicon film.

26. The method for manufacturing a semiconductor device having a metal oxide semiconductor transistor of claim 21, further comprising:
anisotropically etching a portion of the silicon oxide film formed in the third hole to partially expose the drain region; and
depositing a conductive material to fill between the gate electrode structures to form self-aligned contacts for pad electrodes making contact with the source and the drain region.

27. A method for manufacturing a semiconductor device having a metal oxide semiconductor transistor, the method comprising:
forming an active region and a field region on a silicon substrate so that a first face of the field region extends beyond a corresponding first face of the active region;
selectively forming an oxide film on the active region;
etching the oxide film to expose portions of the substrate corresponding to the active region;
forming a silicon film on an entire upper face of the oxide film by a selective epitaxial growth process utilizing silicon in the exposed portions of the substrate as seeds;
forming gate electrode structures on the silicon film positioned on the etched portion of the oxide film wherein each of the gate electrode structures includes a gate oxide pattern and a conductive pattern;

by implanting impurities into the silicon film using the gate electrode structures as masks to form source and drain regions;

forming nitride spacers on sidewalls of the gate electrode structures;

forming an interlayer dielectric film on the nitride spacers wherein the interlayer dielectric film covers the gate electrode structures; and etching the interlayer dielectric using a self-aligning process to form a first contact hole between the gate electrode structures that partially exposes first faces of the source and the drain regions.

28. The method for manufacturing a semiconductor device having a metal oxide semiconductor transistor of claim 27, wherein the step of forming the active and the field regions further comprises;

forming a trench in the substrate by etching a portion of the substrate corresponding to the field region;

forming an insulation film to fill the trench; and chemically and mechanically polishing the insulation film wherein a portion of the insulation film remains only in the trench while remaining portions of the insulation film are removed to expose the substrate.

29. The method for manufacturing a semiconductor device having a metal oxide semiconductor transistor of claim 28, wherein the insulation film is etched slower than the substrate during the chemical-mechanical polishing step.

30. The method for manufacturing a semiconductor device having a metal oxide semiconductor transistor of claim 27, wherein forming an active region and a field region comprises etching a portion of the substrate corresponding to the active region to a predetermined depth.

31. The method for manufacturing a semiconductor device having a metal oxide semiconductor transistor of claim 30, wherein etching a portion of the substrate comprises etching a portion of the substrate utilizing an HCl gas or a mixture of a $Cl_2$ gas and an $H_2$ gas at a temperature of approximately 600 to 800° C.

32. The method for manufacturing a semiconductor device having a metal oxide semiconductor transistor of claim 27, wherein the oxide film has a thickness of approximately 30 to 70 percents of a distance between the first face of the active region and the first face of the field region.

33. The method for manufacturing a semiconductor device having a metal oxide semiconductor transistor of claim 27, wherein the exposed portions of the substrate have widths of approximately 80 to 120 percent of lengths of the gate electrodes of the transistor.

34. The method for manufacturing a semiconductor device having a metal oxide semiconductor transistor of claim 27, further comprising polishing the silicon film so that portions of the silicon film and the field region are exposed.

35. The method for manufacturing a semiconductor device having a metal oxide semiconductor transistor of claim 27, further comprising selectively implanting an impurity into the drain region during utilizing the first contact hole.

36. The method for manufacturing a semiconductor device having a metal oxide semiconductor transistor of claim 35, wherein the step of etching the interlayer dielectric using a self-aligning process to form a first contact hole further comprises:

etching the interlayer dielectric film formed on the source region to partially expose the first face of the source region;

etching the interlayer dielectric film formed on the drain region to partially expose the first face of the drain region; and selectively implanting an impurity into the exposed drain region.

37. The method for manufacturing a semiconductor device having a metal oxide semiconductor transistor of claim 27, further comprising:

selectively and anisotropically etching a portion of the silicon film corresponding to the drain region exposed through the first contact hole so that a portion of the oxide film is exposed after forming the first contact hole to provide a second contact hole; and forming a self-aligned contact for a pad electrode making contact with the source and drain regions by filling a conductive material in the second contact hole.

38. A method for manufacturing a semiconductor device having a metal oxide semiconductor transistor comprising:

forming gate electrode structures on a silicon substrate wherein each of the gate electrode structures includes an oxide pattern and a conductive pattern;

implanting impurities into the silicon substrate using the gate electrode structures as masks to provide source and drain regions;

forming nitride spacers on sidewalls of the gate electrode structures;

forming an interlayer dielectric film on the nitride spacers wherein the interlayer dielectric film covers the gate electrode structures;

etching the interlayer dielectric film between the gate electrode structures to partially expose a first face of the drain region using a self-aligning process to provide a first contact hole;

selectively and anisotropically etching a portion of the silicon substrate exposed though the first contact hole, the portion corresponding to the drain region to provide a second contact hole, wherein the second contact hole is formed to a second face of the drain region opposite the first face of the drain region;

forming a spacer on a lateral portion of the drain region using a material having an etching selectivity relative to the silicon substrate;

forming an interlayer dielectric film on the nitride spacers to cover the gate electrode structures;

etching a portion of the silicon substrate exposed through the second contact hole to form a third hole, wherein the third hole extends in vertical and lateral directions with respect to the silicon substrate; and forming a silicon oxide film in the third hole.

39. The method for manufacturing a semiconductor device having a metal oxide semiconductor transistor of claim 38, further comprising selectively implanting an impurity into the drain region after forming the first contact hole.

40. The method for manufacturing a semiconductor device having a metal oxide semiconductor transistor of claim 38, further comprising:

anisotropically etching the silicon oxide film in the third hole after forming the spacer so as to partially expose the drain region; and forming self-aligned contacts for pad electrodes making contact with the source and drain regions respectively by forming a conductive material to fill an area between the gate electrode structures.

41. The method for manufacturing a semiconductor device having a metal oxide semiconductor transistor of claim 38, wherein the spacer includes silicon oxide.

* * * * *